United States Patent [19]

Sharpe-Geisler

[11] Patent Number: 5,760,609
[45] Date of Patent: Jun. 2, 1998

[54] CLOCK SIGNAL PROVIDING CIRCUIT WITH ENABLE AND A PULSE GENERATOR WITH ENABLE FOR USE IN A BLOCK CLOCK CIRCUIT OF A PROGRAMMABLE LOGIC DEVICE

[75] Inventor: Bradley A. Sharpe-Geisler, San Jose, Calif.

[73] Assignee: Advanced Micro Devices, Inc., Sunnyvale, Calif.

[21] Appl. No.: 666,193

[22] Filed: Jun. 19, 1996

Related U.S. Application Data

[62] Division of Ser. No. 458,865, Jun. 2, 1995.

[51] Int. Cl.[6] .................................. H03K 19/00
[52] U.S. Cl. .................... 326/93; 327/298; 327/164; 327/212; 327/291
[58] Field of Search .................. 326/93, 40, 46; 327/291, 298, 299, 164, 208, 212

[56] References Cited

U.S. PATENT DOCUMENTS

| | | | |
|---|---|---|---|
| 3,793,591 | 2/1974 | Trinca | 327/291 |
| 4,251,739 | 2/1981 | Morozumi | 327/208 |
| 4,825,416 | 4/1989 | Tam et al. | 365/194 |
| 4,868,511 | 9/1989 | Des Brisay, Jr. | 327/291 |
| 4,879,481 | 11/1989 | Pathak et al. | |
| 5,023,484 | 6/1991 | Pathak et al. | 326/93 |
| 5,027,315 | 6/1991 | Agrawal et al. | 326/40 |
| 5,117,132 | 5/1992 | Watson et al. | 326/40 |
| 5,164,612 | 11/1992 | Kaplinsky | |
| 5,309,046 | 5/1994 | Steele | 326/39 |
| 5,357,153 | 10/1994 | Chiang et al. | 326/40 |
| 5,359,242 | 10/1994 | Veenstra | 326/39 |
| 5,457,409 | 10/1995 | Agrawal et al. | 326/39 |
| 5,489,857 | 2/1996 | Agrawal et al. | 326/41 |

FOREIGN PATENT DOCUMENTS

| | | |
|---|---|---|
| 0 537 885 A1 | 4/1993 | European Pat. Off. |
| 0 584 911 A1 | 3/1994 | European Pat. Off. |
| WO 94/17595 | 8/1994 | WIPO |

*Primary Examiner*—Edward P. Westin
*Assistant Examiner*—Richard Roseen
*Attorney, Agent, or Firm*—Fliesler, Dubb, Meyer & Lovejoy, LLP

[57] ABSTRACT

A clock signal providing circuit with enable and pulse generator with enable for use in a block clock circuit of a programmable logic device (PLD), the block clock circuit for allocating multiple clock signals to each macrocell of the PLD. The clock signal providing circuit includes circuitry which functions to change states in response to a pin clock signal when an enable signal is active, and to maintain its current state when the enable signal is inactive. The pulse generator includes circuitry which functions to provide a pulse at a first edge of a pin clock signal if an enable signal remains active from prior to receipt of the first edge of the pin clock signal.

3 Claims, 21 Drawing Sheets

5,760,609

1

CLOCK SIGNAL PROVIDING CIRCUIT WITH ENABLE AND A PULSE GENERATOR WITH ENABLE FOR USE IN A BLOCK CLOCK CIRCUIT OF A PROGRAMMABLE LOGIC DEVICE

This application is a divisional of application Ser. No. 08/458,865, filed Jun. 2, 1995, which is currently pending.

BACKGROUND OF THE INVENTION

1. Field of the Invention

The present invention relates to output logic macrocells and clock signal allocation circuitry for a programmable logic device (PLD). More particularly, the present invention relates to providing the macrocells and clock signal allocation circuitry so that PLD resources which typically only provided one function can be programmed to provide one of multiple functions.

2. Description of the Related Art

FIG. 1 shows components from a conventional programmable logic device (PLD), including a macrocell 100, typically provided in a macrocell of the PLD. In the portion of the PLD shown, a group of product term (PT) lines PT1–PT4 are provided which may each be selectively connected to a number of array cells (not shown). A sum of product terms output can be provided by connecting the PT lines through an OR gate 102.

To provide polarity control, a PT line, PT4, is typically provided to a polarity determination circuit 110 which provides both the PT4 signal and its inverse as controlled by the polarity selection signal POL and its inverse POL. The output of the polarity determination circuit 110 is fed with the output of OR gate 102 to an exclusive OR gate 120.

The output of the exclusive OR gate 120 is provided to macrocell 100, which typically includes a register 130, pass gates 132 and 134, and a feedback line 136, as well as other components which are not shown in FIG. 1. To provide a registered output, the output of exclusive OR gate 120 is provided through register 130 and pass gate 132 to an output buffer 140. To provide a combinatorial output, the output of the exclusive OR gate 120 is provided through pass gate 134 to output buffer 140. Feedback 136 is provided to couple the signal provided to output buffer 140 back to be selectively connected to individual product term lines PT1–PT4.

Global signals for a reset, preset and a clock are provided to the register 130 of macrocell 100, as well as to other registers of other macrocells in the PLD. Non-global reset, preset and clock signals may also be provided to the registers through a product term line. For instance, using two programmable fuses F2 and F3, as shown in FIG. 1, a reset can be provided to register 130 from product term line PT1.

FIG. 2 shows typical components utilized in register 130. The circuitry includes two latches 200 and 202 connected in series. The Q output of latch 200 is connected to the data input of latch 202 and the clock input of latch 200 is inverted from the clock input of latch 202 to form a D-type flip-flop.

FIG. 3 shows typical circuitry for the latches 200 and 202 of FIG. 2. As shown, the typical latch includes an inverter 300 with its input forming the Q output of the latch and its output forming the $\overline{Q}$ output of the latch. The latch also includes an inverter 302 with its output connected to the Q output and its input connected to the $\overline{Q}$ output. A data signal is provided to the Q input of the latch 300,302 through a latch pass gate 304 which receives the clock signal at its gate.

2

To enable PLD resources to be selectively configured so that register 100 of FIG. 1 may alternatively be used as a latch, additional circuitry (not shown) is typically added to the register circuitry of FIG. 2. The additional circuitry includes an additional pass gate with its gate controlled to provide the Q output of latch 200 directly as the Q output of register 130, bypassing latch 202.

To enable PLD resources to be further selectively configured so that the D-type flip-flop circuitry of register 130 may alternatively be utilized to provide the function of a T-type flip-flop, the PLD needs only to be appropriately programmed. Typical circuitry for a T-type flip-flop is shown in FIG. 4. As shown, the T-type flip-flop includes a D-type flip-flop circuit 130 as shown in FIG. 2. The Q output of the D-type flip-flop 130 is inverted and selectively fed back to the D input of the D-type flip-flop 130. By appropriately programming a PLD so that the feedback line 136 is appropriately connected to product terms connected to the input of register 130 of FIG. 1, such a T-type flip-flop may be created.

A PLD is designed so that its resources may be selectively configured by a user to create the specific circuitry the user desires. Components of the PLD which form only one particular circuit, the particular circuit not being desired by the user, will create a wasted resource, unnecessarily occupying chip space. Such circuitry includes one of the pass gates 132 and 134 for selectively providing the registered and combinatorial modes, since only one mode will be desired. Further, if a latch mode is desired rather than a registered mode, the latch 202 of FIG. 2 will be bypassed and provide a wasted resource. Additionally, if a reset or preset are not desired, additional circuitry provided in a register (not shown) to enable the reset and preset functions will provide a wasted resource.

SUMMARY OF THE INVENTION

The present invention enables components of a PLD which typically only provided one function to be programmed to provide one of multiple functions.

The present invention further enables additional clocking functions on a PLD.

The present invention includes a block clock/control circuit for allocating clock signals to output logic macrocells of a PLD, the block clock/control circuit providing multiple clock signals to each macrocell.

The present invention further includes a modified circuit configuration for macrocells in the PLD. In the present invention, a macrocell includes a multiplexer with an output connected to the clock input of a storage element, which may be a latch, the multiplexer being controlled to selectively provide one of the block clock signals to the clock input of the storage element. The storage element further has a data input and an output forming the macrocell output, wherein a sum of product terms output from an OR gate is received at the data input and is provided to the output based on a signal received at the clock input, similar to a latch. Vcc may be provided as one of the inputs to the multiplexer to enable the storage element to function in a combinatorial mode.

The multiple clock signals provided by the block clock/control circuit may first include a clock signal provided directly from the block clock/control circuit to the multiplexer, which when selected enables the storage element to function in a latch mode. A clock signal may also be provided from the block clock/control circuit through a pulse generator to provide a clock pulse having a pulse width δ to enable the storage element to function in a D-type flip-flop mode.

So that the storage element can function more similar to a D-type flip-flop, the storage element may be configured to be a P-type flip-flop. A P-type flip-flop is defined by the present invention as a device having an output changing states to follow its data input at a leading edge of a clock input, then does not change states for a period ε, wherein ε>δ, and then its output will change states to match its data input after the period ε if a signal is received at the clock input has a period greater than ε.

The block clock/control circuit may be further configured to provide signals enabling dual edge clocking, reset or preset, clock edge selection, clock enabling, asynchronous clocking or mixed clocking modes.

To provide reset or preset without requiring specialized circuitry to be added to the storage element, which is normally required for reset or preset, a particular signal may be provided to the data input of the storage element, as well as through a pulse generator in the block clock/control circuit, to provide a corresponding particular pulse. To assure that reset and preset properly occur, the time period from receipt of the leading edge of the particular signal at the data input of the storage element until receipt of the trailing edge of the particular pulse at the clock input of the storage element is controlled to be greater than ε.

A mixed clocking mode, or a mixture of two clocking mode signals on a single clock line may be provided in a manner similar to reset and preset to assure changes in each clocking signal making up the mixed clocking signal properly occur.

Utilizing such a block clock/control circuit and macrocell configuration, the present invention provides selection of a combinatorial mode, latch mode, or D-type flip-flop mode, as well as other modes using limited circuitry without having circuitry providing only one function resulting in wasted PLD resources as in prior art PLD circuitry of in FIG. 1. For instance, additional pass gates are not required to provide selection of a registered or combinatorial mode, such as 132 and 134 of FIG. 1, with one pass gate always providing a wasted PLD resource. Further, additional pass gates are not required to provide selection of a register or latch mode, with one pass gate always providing a wasted PLD resource. Further, during selection of a latch mode, circuitry for one latch required for a register mode, such as 202 of FIG. 2, is not bypassed, creating a significant wasted PLD resource. Additionally, to provide reset or preset, the present invention eliminates the need for circuitry normally provided in a register of a macrocell for reset and preset, as well as the need for global reset and preset lines provided throughout a PLD. Although additional circuitry is required to provide the block clock/control circuit, the block clock/control circuit is a shared resource with its signals being provided globally to all macrocells of the PLD.

BRIEF DESCRIPTION OF THE DRAWINGS

Further details of the present invention are explained with the help of the attached drawings in which.

DETAILED DESCRIPTION

Figure 5:
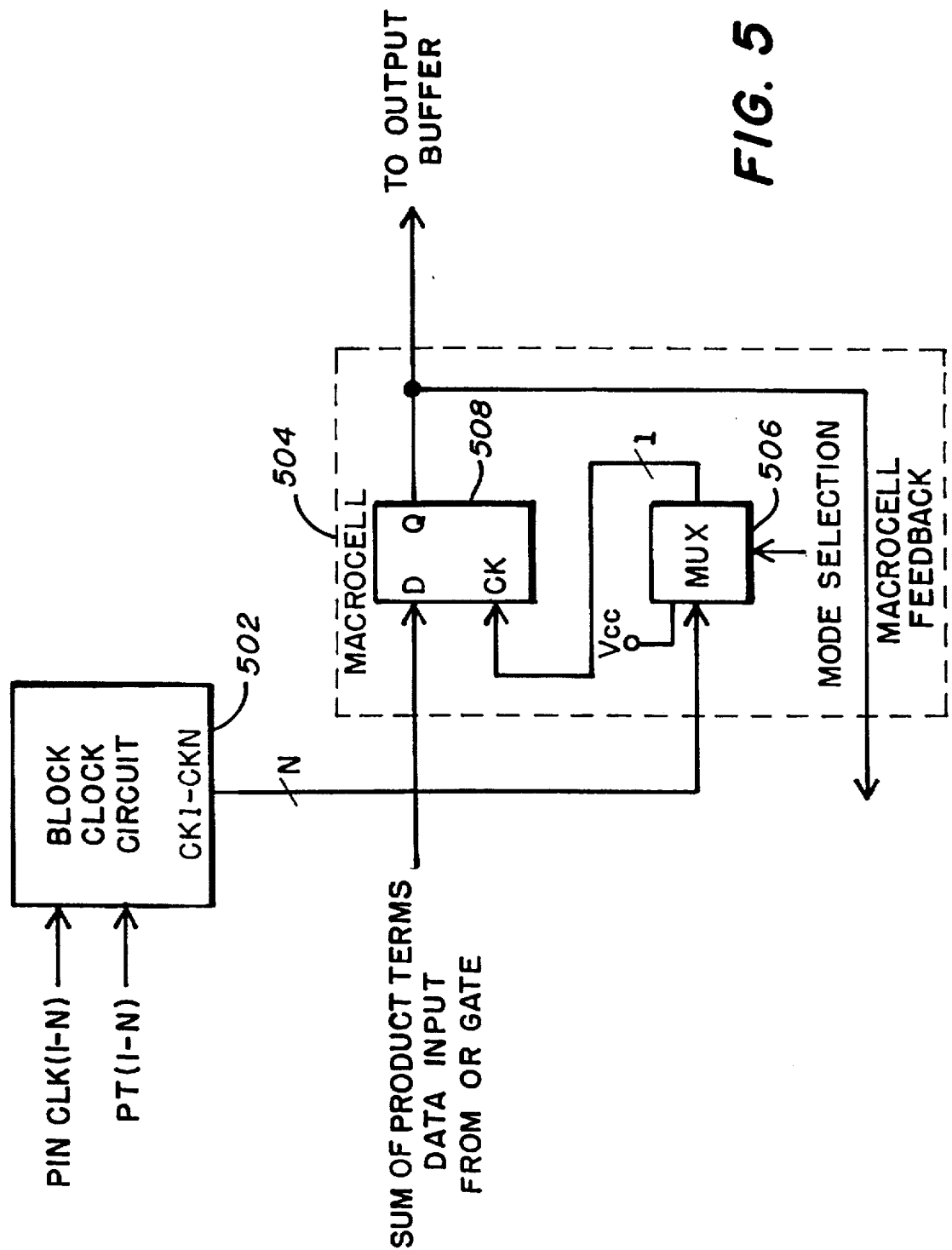
FIG. 5 shows a block diagram of components of the present invention.

FIG. 5 shows a block diagram of components of the present invention. As shown, the present invention utilizes a block clock/control circuit 502 along with an output logic macrocell 504.

The block clock/control circuit 502 includes clock signal allocation circuitry to provide a plurality of clock signals CK1-CKN at its outputs. The block clock circuit provides the CK1-CKN signals by allocating one or more pin clock (PIN CLK1-N) and product term (PT1-PTN) input signals. The outputs of the block clock/control circuit 502 are provided as global signals throughout a PLD to macrocells in the PLD, such as macrocell 504.

Figure 1:
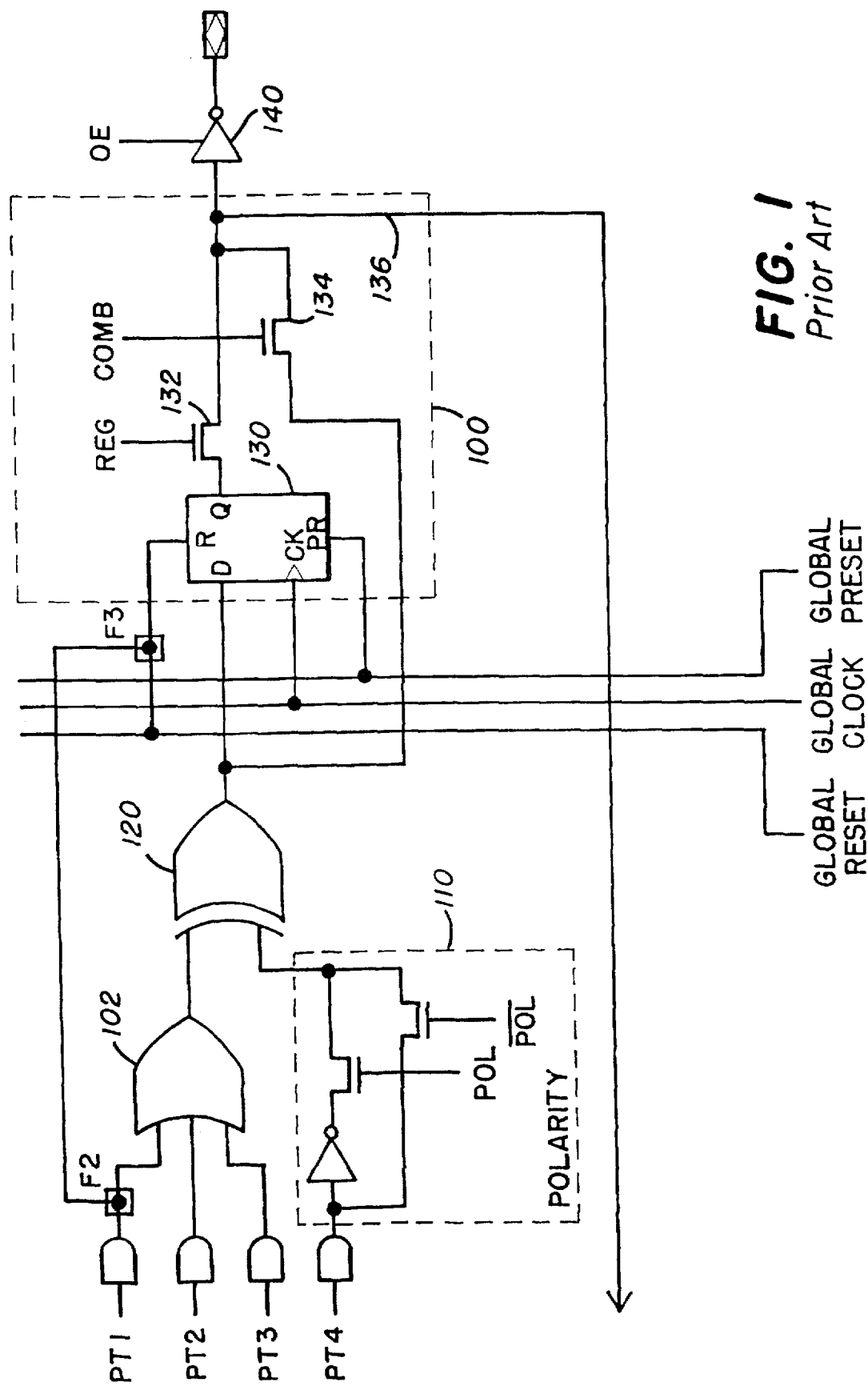
FIG. 1 shows components from a conventional PLD.
Figure 2:
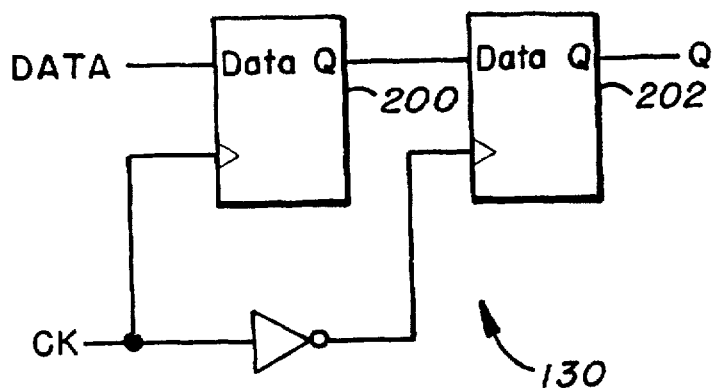
FIG. 2 shows typical components utilized in the register of FIG. 1.
Figure 3:
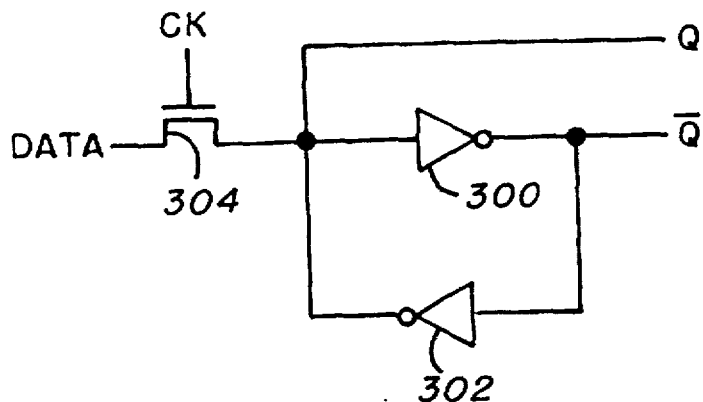
FIG. 3 shows typical circuitry for the latches of FIG. 2.
Figure 4:
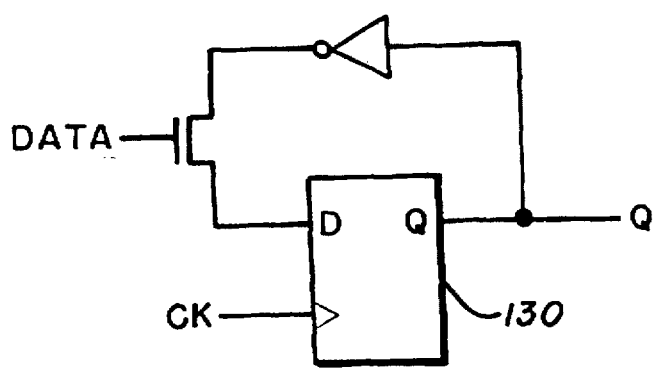
FIG. 4 shows typical circuitry for a T-type flip-flop.

The macrocell 504 of the present invention includes a multiplexer 506 and storage element 508. Inputs of the multiplexer 506 are connected to outputs of the block clock/control circuit 502. The multiplexer 506 further receives a mode selection signal to enable the multiplexer 506 to provide one of the clock signals received from the block clock/control circuit 502 to its output. The output of the multiplexer 504 is provided to the clock signal input of the storage element 508. The storage element 508 can include circuitry similar to the latch of FIG. 3 with a data input provided to its output based on a signal received at its clock input. The data input of storage element 508 may receive a sum of product terms output from the output of an OR gate 102 as shown in FIG. 1, either directly or through the output of exclusive OR gate 120 if polarity selection is provided. A description for circuitry providing a sum of product terms output can be found in U.S. pat. application Ser. No. 8/459,960 entitled "Very High Density Complex Programmable Logic Devices With A Multi-Tiered Hierarchical Switch Matrix and Optimized Flexible Logic Allocation," filed Jun. 2, 1995, and incorporated herein by reference. The Q output of the storage element 508 is provided to an output buffer of the PLD, such as buffer 140 of FIG. 1. Additionally, the Q output of the storage element 508 is provided in the PLD as a macrocell feedback, similar to line 136 of FIG. 1.

By providing appropriate clocking signals from the block clock/control circuit 502, the macrocell 504 can be selectively controlled to provide the functions normally provided by a conventional macrocell. For instance, by applying an appropriate clocking and mode select signals to multiplexer 506, the storage element 508 can operate in a latch mode, a D-type flip-flop mode, or a combinatorial mode. By applying appropriate clock and data signals, the storage element 508 can also provide the reset and preset capability provided in a conventional macrocell without requiring additional circuitry. Unlike with conventional macrocells, with the circuitry of FIG. 5, appropriate clock signals can be applied to provide dual edge clocking, clock edge selection, asynchronous clocking, clock enabling, or a mixture of different type clock signals.

To provide a combinatorial mode of operation, Vcc can be provided directly as one of the multiplexer inputs of a macrocell, or as one of the block clock/control circuit outputs. With Vcc applied to the clock input of a storage element of a macrocell, such as storage element 508, the storage element appears transparent to a data signal received.

Figure 6:
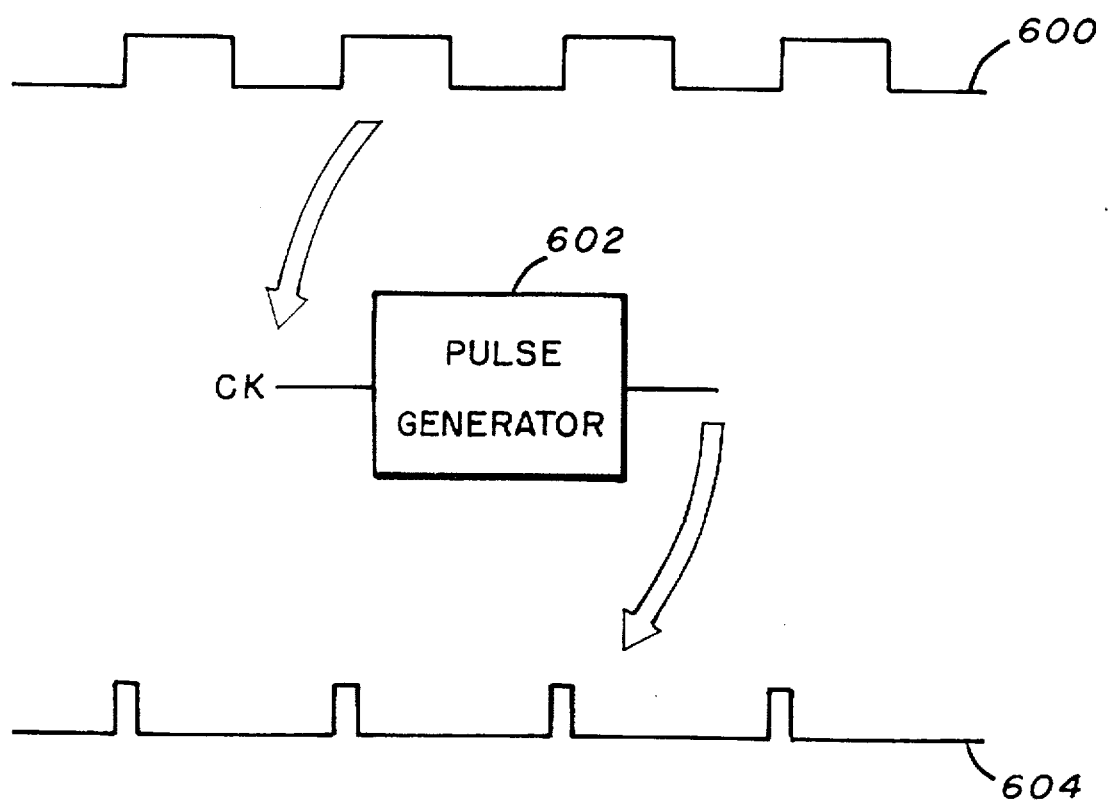
FIG. 6 illustrates signals and components utilized to provide a D-type flip-flop mode of operation.

To provide a latch mode of operation, circuitry is provided in the block clock/control circuit to provide a clock signal 600, as shown in FIG. 6, as one of the clock signals CK1-CKN from block clock/control circuit 502 of FIG. 5. The latch mode clock signal 600 may be allocated to one of the block clock/control circuit outputs from a pin clock input to the chip, or from an appropriately configured product term line.

To provide a D-type flip-flop mode of operation, the block clock/control circuit includes a pulse generator, and the clock signal 600 is provided through a pulse generator 602, the pulse generator 602 providing narrow pulses 604 occurring at the leading edge of pulses of clock signal 600, as shown in FIG. 6. The narrow pulses 604 from the pulse generator, when applied to the clock input of the storage element 508, enables the storage element 508 to function similar to a conventional D-type flip-flop. For example, with a D-type flip-flop having components shown in FIG. 3 receiving clock signal 600, its Q output will change states to conform to an input data signal only at the leading edge of pulses of the clock signal 600.

A conventional D-type flip-flop typically provides edge sensitivity such that an input data signal is provided at a Q output of the D-type flip-flop only at one edge of a clock pulse, depending on an input data signal state before transition of a clock pulse edge. Metastability defines a state for a D-type flip-flop where a glitch occurs and the register does not accurately provide such a Q output at the edge of a clock pulse. Register stability is determined by the difficulty for a particular register to enter a metastable state and the difficulty for the particular register to recover from the metastable state.

For the storage element 508 provided with an input clock pulse signal to enable a function similar to a D-type flip-flop, clock pulses provided at edges of a clock signal, such as 604, need to be long enough to enable the Q output of storage element 508 to become consistent with an input data pulse. With pulses 604 having a pulse width long enough to assure an input data signal is properly latched, when the input data signal changes states while a clock pulse is provided from a pulse generator, metastability, or an error can occur as illustrated in FIG. 7.

Figure 7:
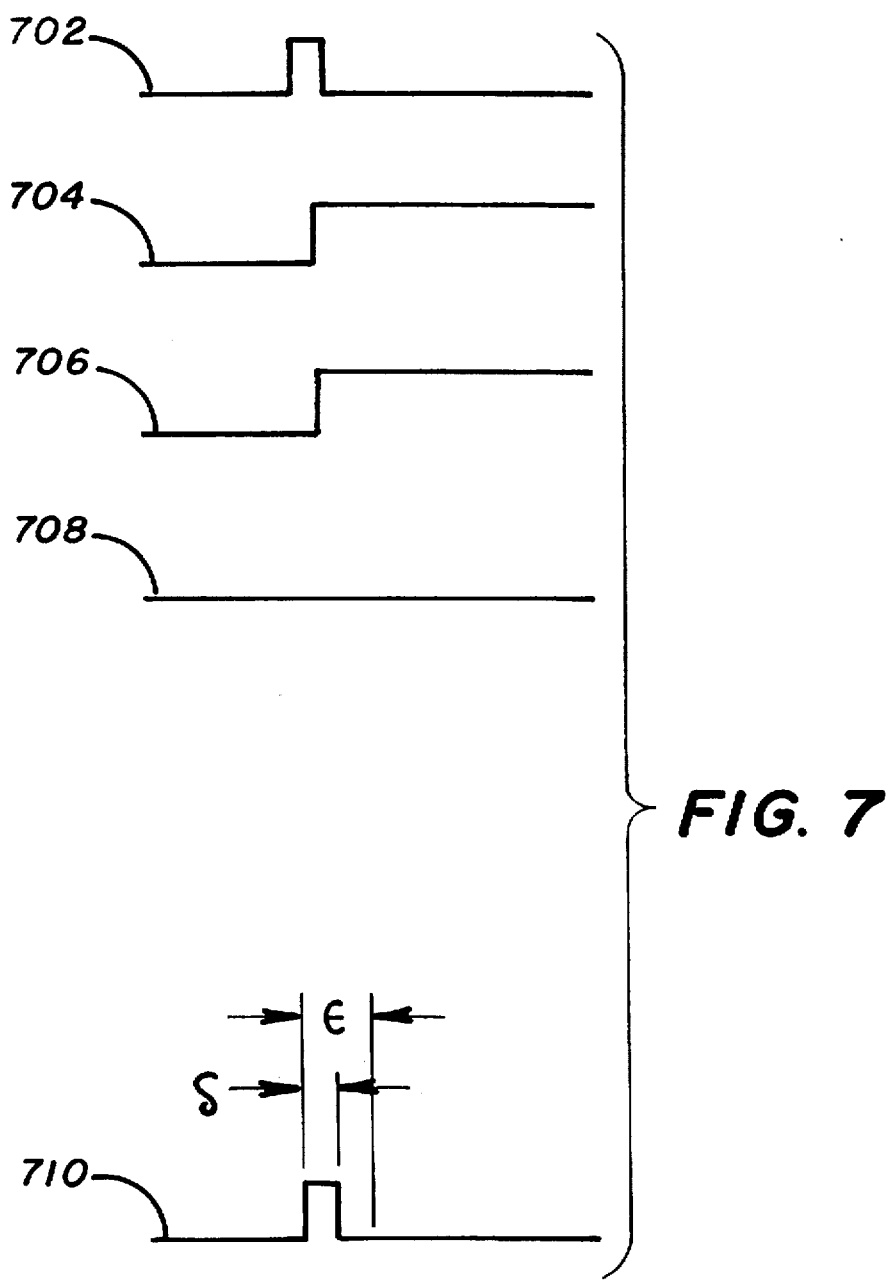
FIG. 7 shows signals illustrating metastability occurring in a typical latch design receiving a D-type flip-flop mode signal as illustrated in FIG. 6.

As shown in FIG. 7, with a clock pulse 702 from a pulse generator applied to the clock input the storage element 508 along with a data signal 704, a glitch signal such as 706 can be generated from the Q output of the storage element 508 creating a metastable state. The signal 706 occurs because the signal 702 is changing during application of the pulse signal 704. For a conventional D-type flip-flop configuration with an input data signal having an edge corresponding with application of pulse 702, the output of the D-type flip-flop is shown at 708.

To enable the storage element 508 to function similar to a D-type flip-flop while avoiding matastability as described with respect to the signals of FIG. 7, the storage element 508 can be configured to operate as a P-type flip-flop. In the present invention, a P-type flip-flop is defined wherein its output will change states to follow its data input at a leading edge of its clock input, then does not change states for a period $\epsilon$, and then its output will change states to match its data input after the period e if a signal received at the clock input has a pulse period greater than $\epsilon$. As illustrated by line 710 of FIG. 7, the period $\epsilon$ is set to be slightly greater than the period 6 of a clock pulse generated by a pulse generator 602 utilized to provide a D-type flip-flop mode signal.

Figure 8:
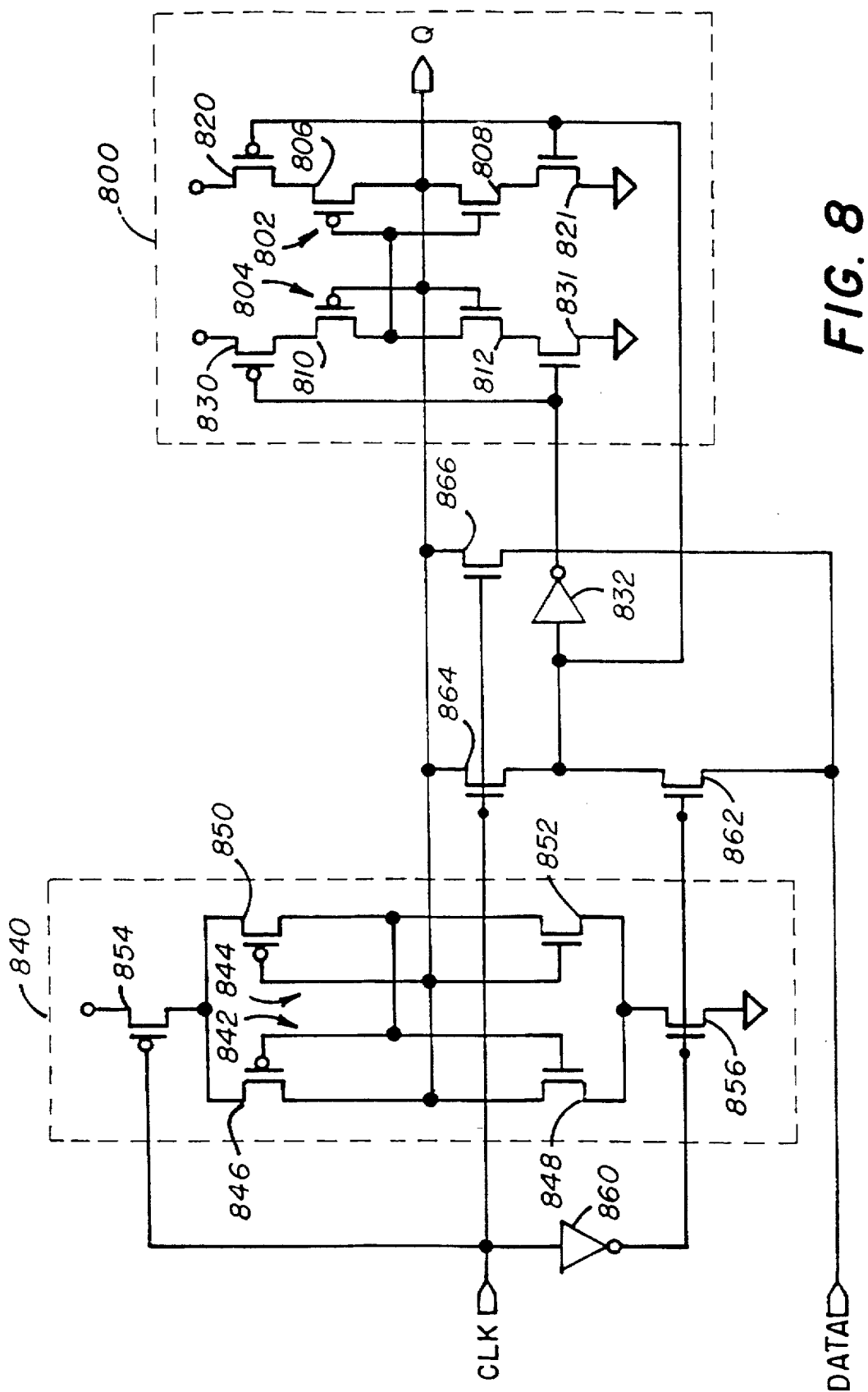
FIG. 8 shows an embodiment of a storage element of the present invention configured to operate as a P-type flip-flop.

FIG. 8 shows an embodiment of a storage element of the present invention configured to operate as a P-type flip-flop. The circuit includes a first regenerative latch 800 made up of a first inverter 802 having an input forming the P-type flip-flop Q output, and an output, and a second inverter 804 having an input connected to the first inverter output and an output connected to the first inverter input. The first inverter 802 includes a PMOS pull up transistor 806 and an NMOS pull down transistor 808 with source to drain paths connected together on one end forming the P-type flip-flop Q output, and gates connected together. The second inverter is made up of a PMOS pull up transistor 810 and an NMOS pull down transistor 812 with source to drain paths connected together on one end and to the input of inverter 802, and gates connected together and to the output of inverter 802.

The first regenerative latch 800 further includes enabling circuitry, including a first pair of PMOS and NMOS transistors, 820 and 821, and a second pair of PMOS and NMOS transistors 830 and 831. PMOS transistor 820 has a source to drain path connecting the source of PMOS transistor 806 to Vcc. NMOS transistor 821 has a source to drain path connecting the source of NMOS transistor 808 to Vss. The gates of transistors 820 and 821 are connected together. PMOS transistor 830 has a source to drain path connecting the source of PMOS transistor 810 to Vcc. NMOS transistor 831 has a source to drain path connecting the source of transistor 812 to Vss. The gates of transistors 830 and 831 are connected together. The gates of transistors 820 and 821 are connected to the gates of transistors 830 and 831 through an inverter 832.

The circuit of FIG. 8 additionally includes a second latch 840 including a third inverter 842 having an input connected to the storage element Q output, and a fourth inverter 844 having an input connected to the third inverter 842 output and an output connected to the third inverter 842 input. The third inverter 842 includes a PMOS pull up transistor 846 and an NMOS pull down transistor 848 with source to drain paths connected together and to the storage element Q output. The fourth inverter is made up of a PMOS pull up transistor 850 and an NMOS pull down transistor 852 with source to drain paths connected together on one end and to the input of third inverter 842, and gates connected together and to the output of third inverter 842.

The second latch 840 further includes enabling circuitry including a PMOS transistor 854, and an NMOS transistor 856. PMOS transistor 854 has a source to drain path connecting the source of PMOS transistors 846 and 850 to Vcc. NMOS transistor 856 has a source to drain path connecting the source of NMOS transistors 848 and 852 to Vss. The gate of transistor 854 is connected to the clock input of the P flip-flop. The gate of transistor 856 is coupled to the clock input of the P flip-flop through a timing inverter 860.

The output of timing inverter 860 is further connected to a pass gate transistor 862. The pass gate 862 has a source to drain path connecting the P flip-flop data input to the gates of transistors 820 and 821. The P flip-flop clock input is connected directly to the gate of an additional pass gate 864. The pass gate 864 has a source to drain path connecting the P flip-flop Q output to the gates of transistors 820 and 821. An additional pass gate 866 has a gate connected directly to the P flip-flop clock input. The pass gate 866 has a source to drain path connecting the P flip-flop data input to the P flip-flop Q output.

In operation, it is first assumed that the clock signal (CLK) is low. With CLK low, transistors 854 and 856 turn on to enable inverters 842 and 844 causing latch 840 to latch the current state of the Q output of the P flip-flop. With the clock input signal low, transistors 864 and 866 remain off so that a changing signal (DATA) at the data input of the P-type flip-flop signal does not effect the state of the P flip-flop Q output.

Further with clock low, transistor 862 is on so that the DATA signal state controls turn on or turn off of transistors 820, 821, 830 and 831 which supply power to the regenerative latch 800. The state of transistors 820, 821, 830 and 831 then make transition of the P-type flip-flop Q output to match the state of the DATA signal rapid when the CLK signal goes high. The state of transistors 820, 821, 830 and 831 will also resist change in the Q output should the DATA signal change states after the CLK signal goes high.

When the CLK signal goes high, transistors 854 and 856 turn off to disable inverters 842 and 844, disabling latch 840. Further, transistors 864 and 866 turn on. Transistor 866 will then carry the DATA signal to the Q output.

If the DATA signal changes states up to a time slightly before transition of CLK to high, because of the delay of the CLK signal change through inverter 860, transistor 862 will still be on to enable the states of transistors 820, 821, 830 and 831 to be preset to conform with the DATA signal. Thus, once CLK goes high, the preset states of transistors 820, 821, 830 and 831 will enable the Q output to rapidly change states to conform with the DATA signal provided through transistors 866.

If the DATA signal changes state slightly after transition of CLK to high, transistor 862 will be off and the preset states of transistors 820, 821 and in conjunction with transistors 806 and 808 will resist a change in the Q output. The DATA signal does pass through transistor 864 to enable the states of transistors 820, 821, 830 and 831 to be reset, but transistors 820, 821, 806 and 808 are sized larger relative to transistor 806 so that the Q output will not change states if the DATA signal changes states immediately after CLK goes high for a period ϵ.

The period ϵ is determined by the sizing of transistors 864, 820 and 821 and will also depend on capacitance on inverter 832. Therefore, as transistor 864 is weaker, the period ϵ will be longer. Likewise, transistors 820 and 821 being larger will increase delay.

Figure 9:
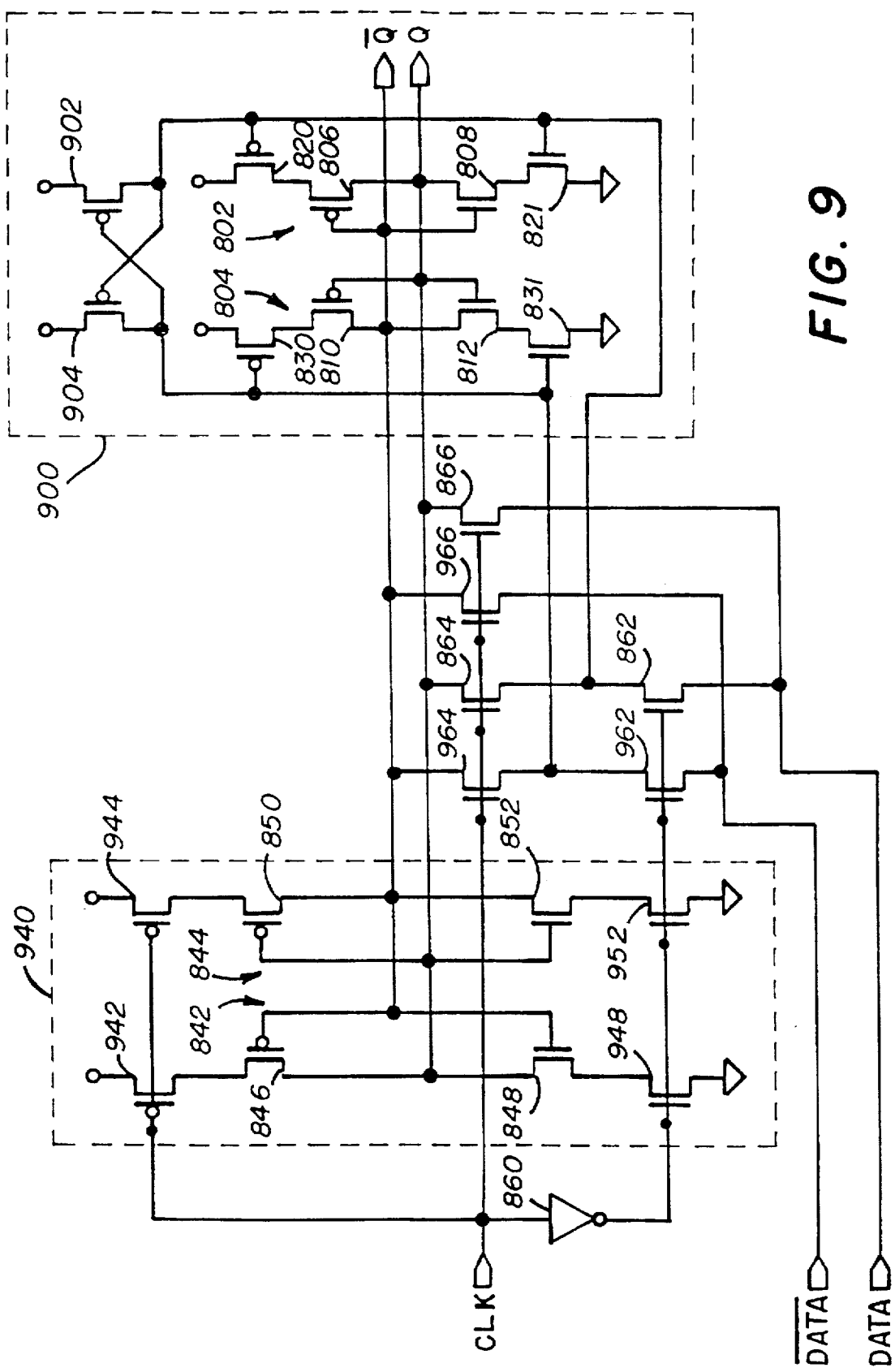
FIG. 9 shows modifications to the circuitry of FIG. 8 to remove gate delays and increase circuit switching speed.

FIG. 9 shows modifications to the circuitry of FIG. 8 to remove gate delays and increase circuit switching speed. Note that circuit components carried forward from FIG. 8 are similarly labeled in FIG. 9, as will be circuit components carried forward in subsequent figures.

The circuit of FIG. 9 includes a first latch 900, similar to the first latch 800 of FIG. 8, but with additional transistors 902 and 904. Transistor 902 has a gate connected to the gates of transistors 803 and 831 and a source to drain path connecting Vcc to the gates of transistors 820 and 821. Transistor 904 has a gate connected to the gates of transistors 820 and 821 and a source to drain path connecting Vcc to the gates of transistors 830 and 831. In operation, transistors 902 and 904 serve to increase the switching speed of transistors 820, 821, 830 and 831 by supplying additional current to the gates of transistors 820, 821, 830 and 831 which receive a high gate signal. Transistors 902 and 904 also minimize power consumption when idle becuse the insure that when/Q or Q is high it goes all the way to Vcc, which will turn off 806 or 810 respectively.

The circuit of FIG. 9 further includes a second latch 940, similar to the second latch 840 of FIG. 8, but with transistor 854 replaced by transistors 942 and 944 and transistor 856 replaced by transistors 948 and 952. As with transistor 854, transistors 942 and 944 have gates connected to the P flip-flop clock input. However, unlike transistor 854, transistor 942 has a source to drain path individually connecting Vcc to the source of transistor 842, while transistor 944 has a source to drain path connecting Vcc to the source of transistor 850. Similarly, as with transistor 856, transistors 948 and 952 have gates connected to the output of timing inverter 860. Further, unlike transistor 856, transistor 948 has a source to drain path connecting Vss to the source of transistor 848, while transistor 952 has a source to drain path connecting Vss to the source of transistor 852. In operation, by individually connecting transistors 842 and 844 to Vcc and transistors 848 and 852 to Vss, the layout is more compact.

Instead of including an inverter 832 which provides a significant gate delay, the circuitry of FIG. 9 is modified to eliminate inverter 832. To enable elimination of inverter 832, transistors 962, 964 and 966 are added to the circuit of FIG. 8 and the DATA signal is received along with its complement $\overline{DATA}$. Transistor 962 has its gate connected to the output of timing inverter 860 and a source to drain path connecting the $\overline{DATA}$ signal to the gates of transistors 831 and 832. Transistor 964 has its gate connected to the P flip-flop clock input and a source to drain path connecting the input of inverter 802 to the gates of transistors 831 and 830. Transistor 966 has its gate connected to the P flip-flop clock input and a source to drain path connecting the $\overline{DATA}$ signal to the input of inverter 802. In operation, the circuitry of FIG. 9 functions similar to the circuit of FIG. 8, with transistors 962 and 964 providing the connection to the gates of transistors 830 and 831 previously provided by inverter 832.

Figure 10:
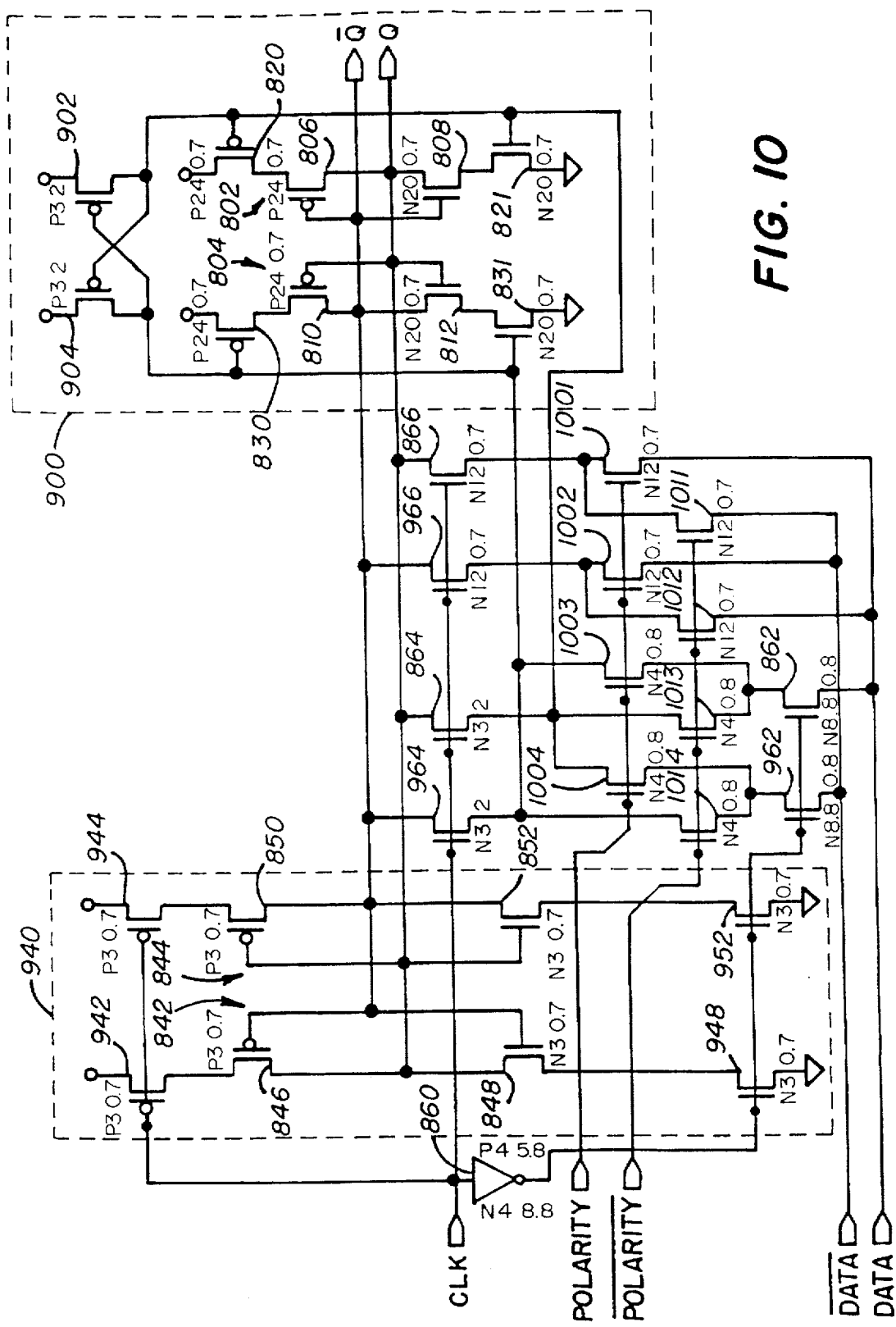
FIG. 10 shows modifications to the circuitry of FIG. 9 to provide a P-type flip-flop which also provides the function of an exclusive OR gate.

Because inverter 832 is so replaced, the period $\epsilon$ is now determined by the RC delay resulting from the size of transistor 864 in combination with transistors 820 and 821, as well as the delay of transistor 964 and the size of transistors 830 and 831. FIG. 10 shows modifications to the circuitry of FIG. 9 to provide a P flip-flop which also provides the function of the exclusive OR gate 120 of FIG. 1. For the transistors shown in FIG. 10, as well as in some subsequent figures, a suggested channel type and transistor dimensions are indicated next to the transistor with a p or n indicating channel type followed by channel width and length in microns. For logic gates such as inverter 860, channel type and dimensions for each transistor are included with the gate logic symbol. Transistor sizes and types are only suggested and may be changed to meet particular design requirements.

To provide the function of an exclusive OR gate, the circuit of FIG. 10 receives a polarity signal (POLARITY), along with its inverse ($\overline{POLARITY}$), wherein when the POLARITY signal is high, the circuit behaves similar to the circuit of FIG. 9, but with POLARITY low, the circuitry of FIG. 10 behaves as if DATA and $\overline{DATA}$ were interchanged.

To provide the function of an exclusive OR gate using the POLARITY and $\overline{POLARITY}$ signals as described, the circuit of FIG. 10 adds transistors 1001-1004 and 1011-1014. Transistors 1001-1004 have gates connected to receive the POLARITY signal, while transistors 1011-1014 have gates connected to receive the $\overline{POLARITY}$ signal. The source to drain path of transistor 1001 connects the source of transistor 866 to receive the DATA signal, while the source to drain path of transistor 1011 connects the source of transistor 866 to receive the $\overline{DATA}$ signal. The source to drain path of transistor 1002 connects the source of transistor 966 to receive the $\overline{DATA}$ signal, while the source to drain path of transistor 1012 connects the source of transistor 966 to receive the DATA signal. The source to drain path of transistor 1003 connects the gates of transistors 830 and 831 to the drain of transistor 862, while the source to drain path of transistor 1013 connects the gates of transistors 820 and 821 to the drain of transistor 862. The source to drain path of transistor 1004 connects the gates of transistors 820 and 821 to the drain of transistor 962, while the source to drain path of transistor 1014 connects the gates of transistors 830 and 831 to the drain of transistor 962.

Figure 11A:
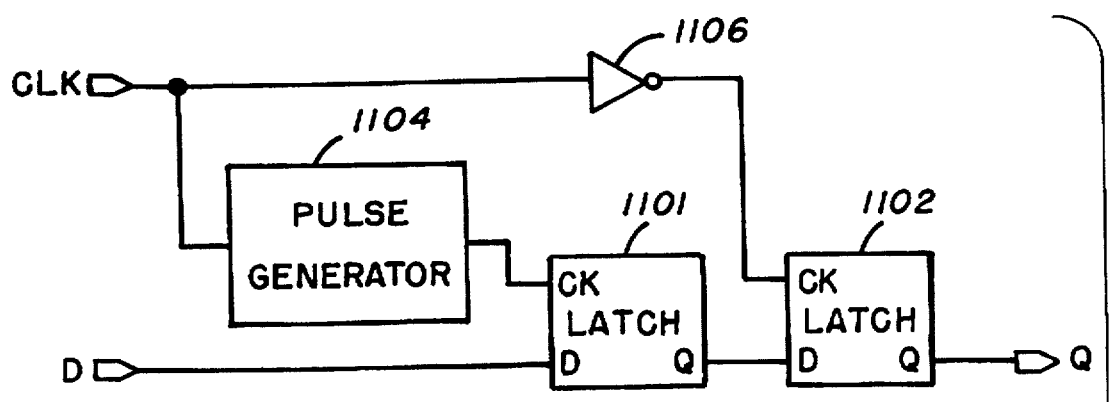
FIG. 11A shows another embodiment of a storage element of the present invention configured to operate as a P-type flip-flop.

FIG. 11A shows another embodiment of a storage element of the present invention configured to operate as a P-type flip-flop. The circuitry of FIG. 11A includes two latches 1101 and 1102, a pulse generator 1104 and an inverter 1106. The data input of the P flip-flop is received at the data input of latch 1101. Further, the clock input of the P flip-flop is received at the input of pulse generator 1104 and the input of inverter 1106. The output of pulse generator 1104 is provided to the clock input of latch 1101, while the output of inverter 1106 is connected to the clock input of latch 1102. The Q output of latch 1101 is provided to the data input of latch 1102, while the Q output of latch 1102 is provided as the P flip-flop output.

Latches 1101 and 1102 are configured so that when a clock signal (CK) is received in a low state, the storage element is transparent, providing its data input (D) directly to its (Q) output. Further, latches 1101 and 1102 are configured so that when a clock signal is received in a high state, the storage element latches the previous state of its Q output when the clock signal was in the low state.

Pulse generator 1104 is configured so that it provides a pulse when its input transitions from the low state to the high state, the pulse period having a pulse width $\epsilon$.

Timing diagrams show a respective clock input signal 1112 and data input 1114 to the P flip-flop of FIG. 11A along with a Q output signal 1116. As illustrated at dashed line A, for the data signal 1114 transitioning and remaining in one state prior to the clock signal 1112 transitioning to high, the Q output signal 1116 will also transition to match the input data signal when the clock signal goes high. However, if the data signal 1114 transitions after the clock signal transitions to high and during any time $\epsilon$ thereafter, the Q output will not transition as, illustrated at dashed line B. After the period $\epsilon$, if the clock input remains high, the Q output will transition to the state of the data input, as illustrated at dahsed line C.

Figure 11B:
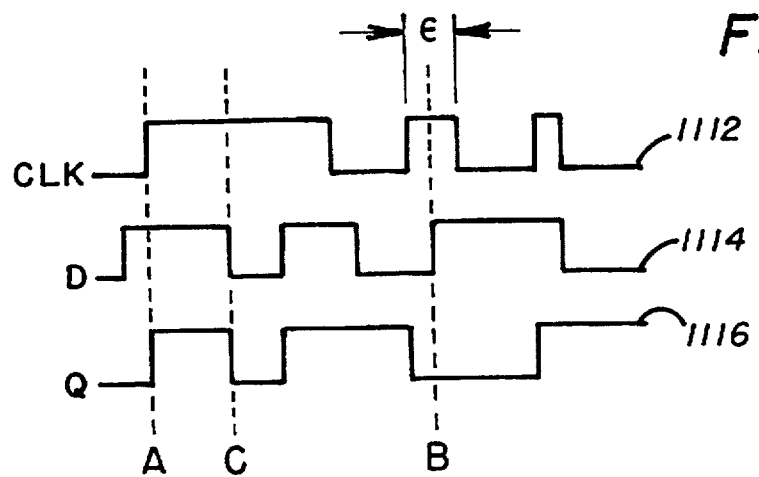
FIG. 11B shows circuitry for a pulse generator which may be utilized in FIG. 11A.
Figure 11B:
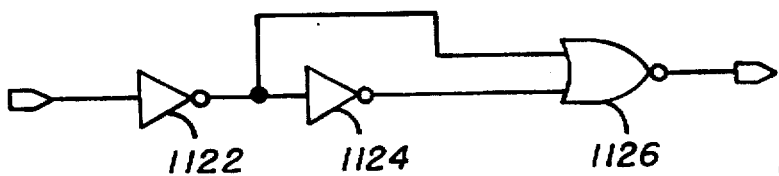

FIG. 11B shows circuitry for a pulse generator which may be utilized as pulse generator 1104. As shown, the pulse generator includes series inverter 1122 and 1124. The input of inverter 1122 is connected to the input of inverter 1124, and the outputs of inverter 1122 and 1124 provide inputs to NOR gate 1126. The input of inverter 1122 forms the pulse generator input and the output of NOR gate 1126 provides the pulse generator output. The inverter 1124 has a delay equal to $\epsilon$ which sets the pulse period of a signal provided at the output of the pulse generator to $\epsilon$. Utilizing a NOR gate, the pulse generator provides a high output pulse when the pulse generator input transitions from low to high.

Figure 11C:
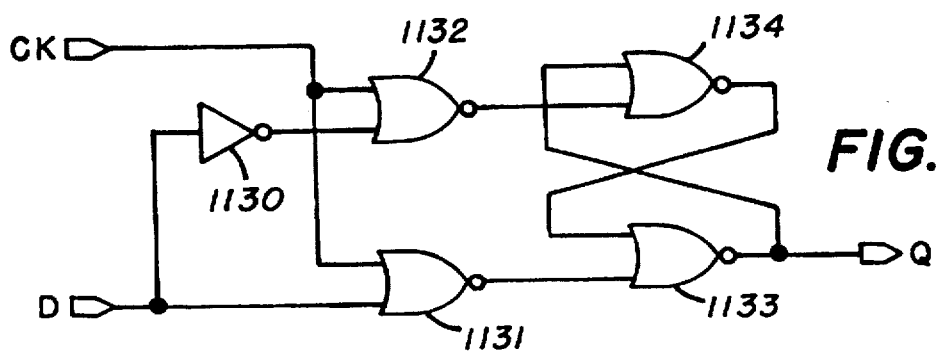
FIG. 11C shows circuitry for a latch which may be utilized in the circuit of FIG. 11A.

FIG. 11C shows circuitry for a latch which may be utilized for each of latches 1101 and 1102. As shown, the latch includes an inverter 1130 and four NOR gates 1131, 1132, 1133 and 1134. The data input (D) of the latch is provided to a first input of NOR gate 1131 and through inverter 1130 to a first input of NOR gate 1132. The clock input (CLK) is provided to second inputs of NOR gates 1131 and 1132. Outputs of NOR gates 1131 and 1132 are provided to respective first inputs of NOR gates 1133 and 1134. The second input of NOR gate 1133 is connected to the output of NOR gate 1134, while the second input of NOR gate 1134 is connected to the output of NOR gate 1133 which further forms the Q output of the latch. Utilizing NOR gates, when the CLK signal is low, the Q output follows the D signal, but when the CLK signal is high, the Q output maintains its previous state.

Although the single pulse generator 602 illustrated in FIG. 6 enables a D flip-flop mode of operation, it only provides pulses at one edge of a clock signal.

Figure 12:
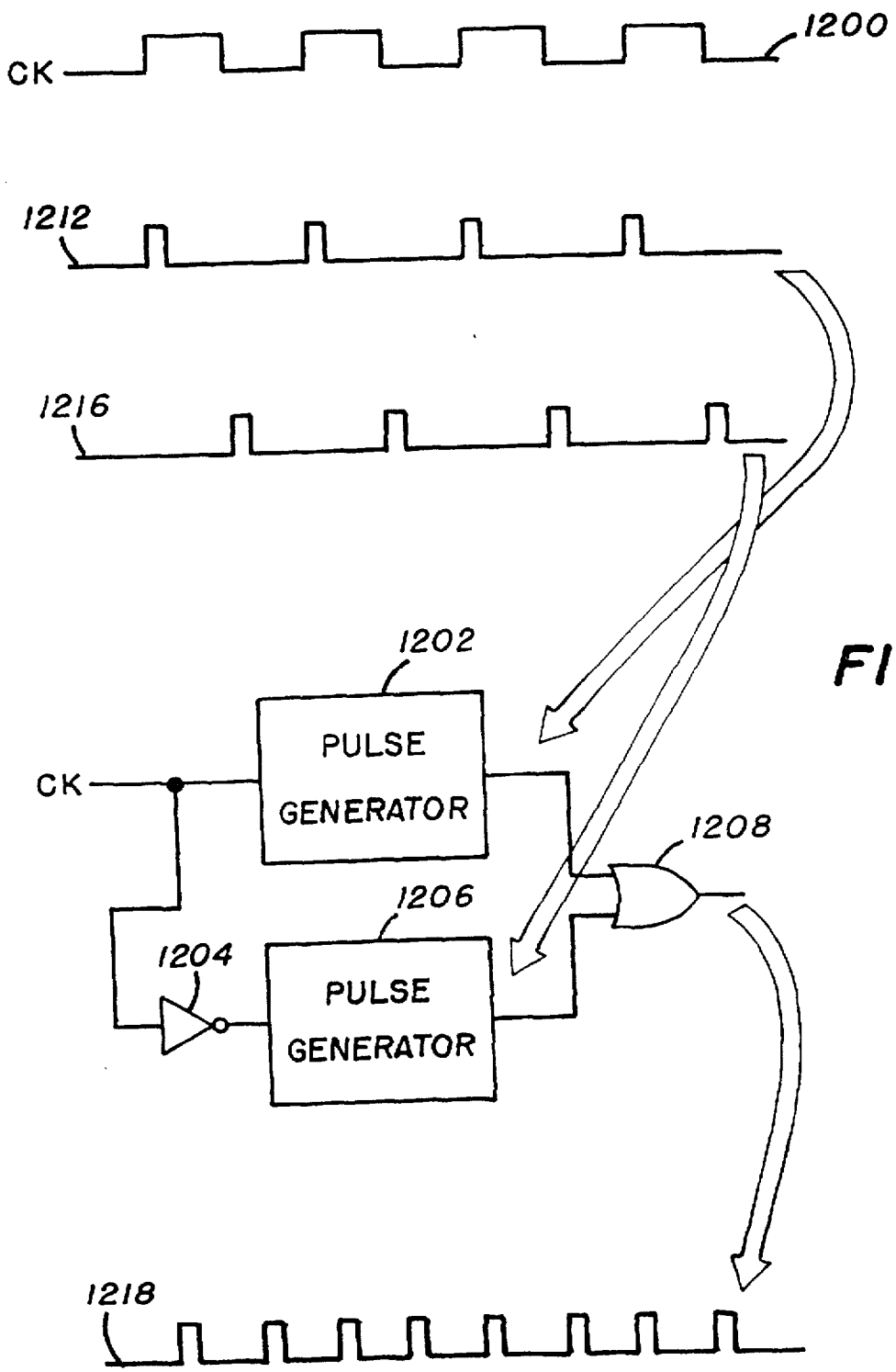
FIG. 12 illustrates signals and components utilized to provide dual edge clocking.

FIG. 12 illustrates how minimal additional circuitry can be utilized in the block clock/control circuit 502 to enable dual edge clocking. To provide dual edged clocking, as illustrated, a clock pulse 1200 is applied to a first pulse generator 1202 and through a series inverter 1204 to a second pulse generator 1206, the second pulse generator 1206 providing output pulses at the same edge of an input clock pulse as the first pulse generator 1202. For example, as shown, with pulse generator 1202 receiving clock signal 1200 and providing an output signal 1212 having pulses occurring at the leading edge of pulses of clock signal 1200, the pulse generator 1206, then, provides an output signal 1216 with pulses which occur at the trailing edge of clock signals 1200. The outputs of pulse generators 1202 and 1206 are, then, provided through an OR gate 1208 which has an output providing a signal 1218 with pulses both at the leading and trailing edges of clock pulse 1200.

Figure 13A:
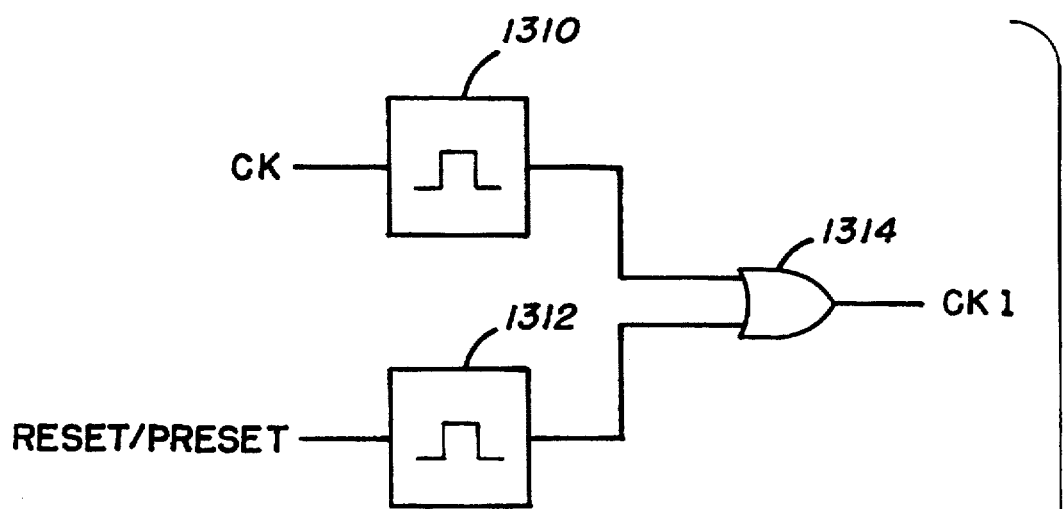
FIG. 13A illustrates circuitry in a block clock/control circuit of FIG. 5 and signals from the block clock/control circuit to provide a reset or preset capability.
Figure 13A:
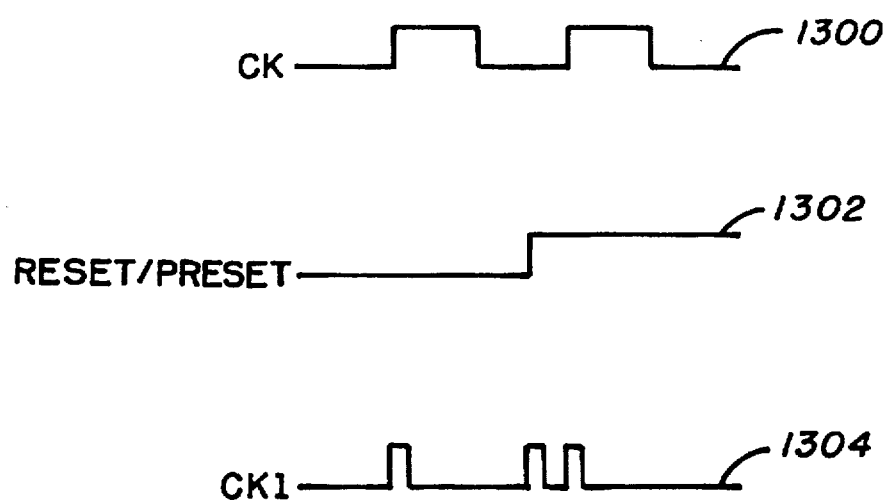

FIG. 13A illustrates circuitry provided in the block clock/control circuit 502 and signals provided from the circuit to provide a reset, preset or mixed clocking capability. Also shown are timing diagrams for input signals 1300 and 1302 and an output signal 1304 for the circuitry. As shown, a clock signal (CK) 1300 is provided to pulse generator 1310, while a reset, preset or second signal for mixed clocking signal 1302 is provided to a pulse generator 1312. The outputs of pulse generators 1310 and 1312 are then combined by applying them through OR gate 1314 to provide an output clock signal (CK1) 1314. The clock signal 1314 may be provided as one of the block clock/control circuit 502 outputs to provide a D-type flip-flop mode signal both at the leading edge of pulses of a clock signal 1300 and at the leading edge of clock signal 1302.

Figure 13B:
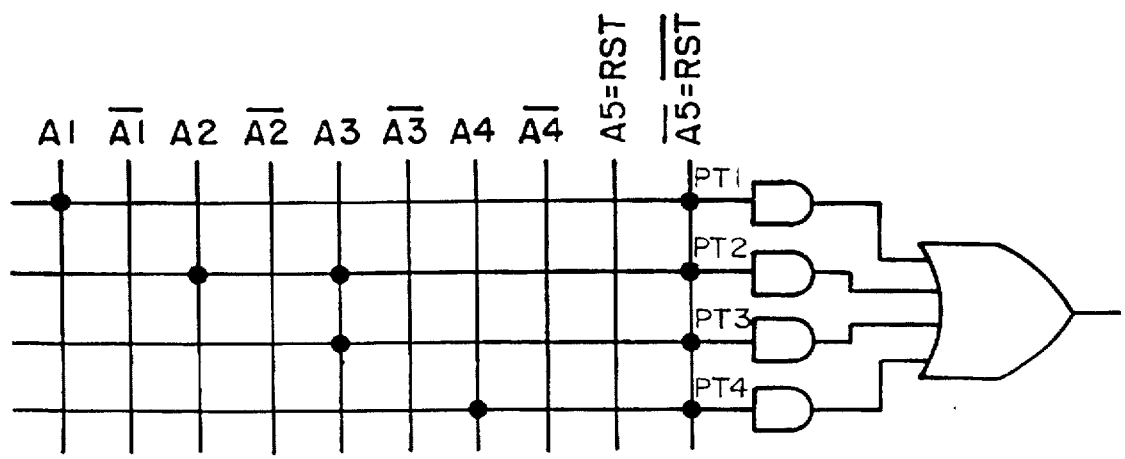
FIG. 13B illustrates additional circuit connections required in a PLD to provide the reset capability.

FIG. 13B illustrates additional circuit connections required in a PLD to provide the reset capability. Because the reset pulse requires that the Q outputs of storage elements be reset to 0, not only must clocking be provided to the clock input of storage elements from the circuitry of FIG. 13A, but also a 0 must be provided as a data input signal. To provide the 0 data input signal, the reset signal 1302 is also applied through each PT line connected to a storage element for which reset capability is desired. In the configuration shown in FIG. 13B, the reset signal is applied through input A5 and its inverse is applied through input $\overline{A5}$. For the line PT1 with only A1 programmed as connected, it is desirable to not have A1 generate a high signal if a reset occurs if reset capability is desired. The line $\overline{A5}$ is therefore connected to create the product term A and not reset, indicated in Boolean as A*/RST. Therefore, when a reset occurs, the PT1 line will be low for the duration of the reset signal. Similar connections are made with respect to lines PT2–PT4 to assure the data input to a storage element which is to be reset remains low.

Figure 13C:
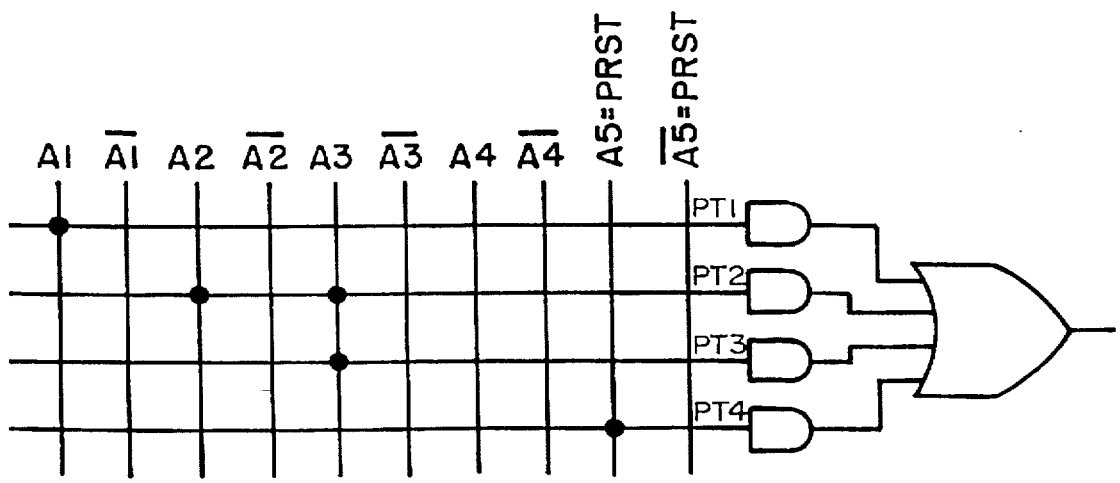
FIG. 13C illustrates additional circuit connections required in a PLD to provide the preset capability.

FIG. 13C illustrates additional circuit connections required in a PLD to provide the preset capability. Because a preset pulse requires that both clock and data inputs of storage elements be set to 1, a high signal must be applied to a storage element data input along with the clocking signal. Unlike the circuit of FIG. 13B where the reset signal is provided on each PT line connected to a storage element, because a storage element output receiving a preset signal must be set to 1 rather than 0, the preset signal is provided separately to a single PT line connected to an OR gate for a storage element where preset capability is desired. As shown in FIG. 13C, the preset pulse is applied through an input, such as A5, which provides the only connection to a PT line of an OR gate. The OR gate output will then provide a high signal whenever a preset signal is received.

Note further that for the reset or preset to occur using a P-type flip-flop, because of the delay ϵ where the output will not transition states, to assure the output changes states, while obtaining maximum speed, it is desirable to control signals such that the rising edge of a particular signal, such as a reset or preset signal, is received at the data input of the P flip-flop prior to the rising of a pulse created from the particular signal arrives at the clock input of the P flip-flop. To obtain maximum speed, not only is this condition true for reset and preset signals, but also other particular signals, such as toggling where the particular signal is applied both directly to the data input of a P flip-flop and through the block clock/control circuit to the clock input of the P flip-flop.

Figure 14:
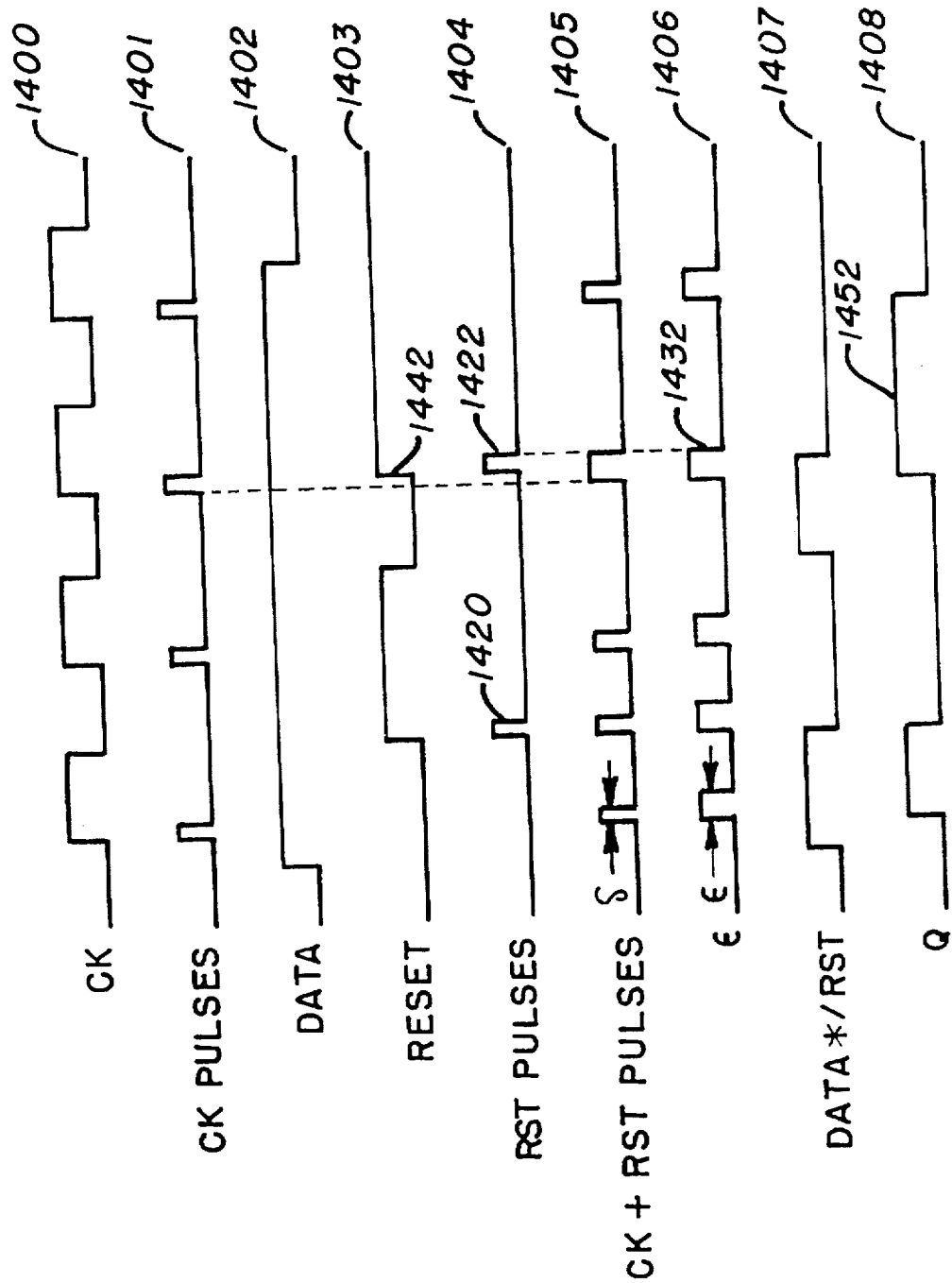
FIG. 14 shows signals illustrating how errors can occur when applying signals to create a reset utilizing a P-type flip-flop.

FIG. 14 shows signals illustrating how errors can still occur when applying signals to create a reset utilizing a P-type flip-flop. FIG. 14 shows a clock signal 1400 which is provided through a pulse generator to create clock pulses 1401. Further, a data signal 1402 and reset signal 1403 are shown. The reset signal 1403 is provided through a pulse generator to obtain reset pulses 1404. The reset pulses 1404 occur with a first pulse 1420 occurring at a different time period than clock pulses 1401, but with a second pulse 1422 occurring during a clock pulse in pulses 1401. The clock pulses 1401 and reset pulses 1404 are combined to form pulses 1405, with a time period ϵ from the beginning of each pulse shown as 1406. Further, a combined data and not reset "DATA*/RST" 1407 is shown, and a P flip-flop Q output 1408 is shown.

To provide the reset capability as illustrated in FIGS. 13A–13C, the combined data and reset pulse signal 1405 is applied to the clock input of a P-type flip-flop and the DATA */RST signal is 1407 applied to the data input of the P flip-flop so that the P flip-flop Q output is 1408. As indicated, with a reset pulse 1422 occurring near the end of ϵ period 1432, reset signal portion 1442 does not have sufficient time while high signals are applied to enable a P flip-flop to generate the reset at its Q output. Pulse 1452, therefore, does not go low to indicate a reset when the reset actually occurred, but stays high until the next clock pulse. Note that similar errors can occur when applying signals to a P flip-flop to create preset or mixed clocking modes.

Figure 15A:
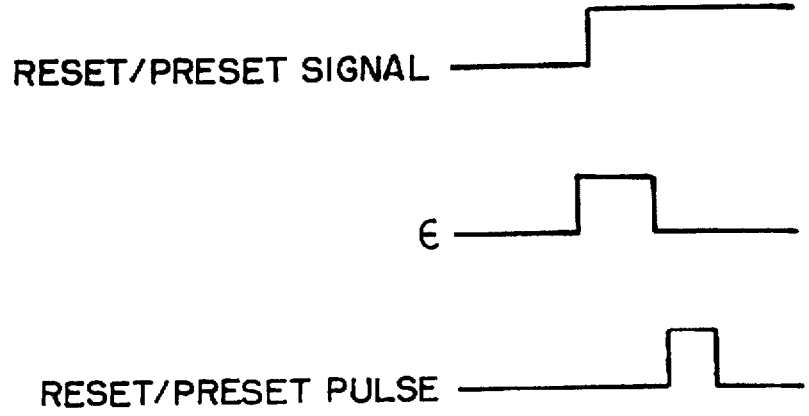
FIG. 15A illustrates a first method to properly enable reset, preset or a mixed clocking mode signal when using a P-type flip-flop.

FIG. 15A illustrates a first method to properly enable reset, preset or a mixed clocking mode signal when using a P-type flip-flop. As shown, the time of receipt of the leading edge of the reset, preset or mixed clocking signal by the P flip-flop until the time of receipt of the corresponding reset, preset or mixed clocking pulse by the P flip-flop can be delayed to be longer than the time period ϵ as illustrated in FIG. 15A. Utilizing this method, a clock signal will be received immediately after the time period ϵ to enable a reset, preset or mixed clocking signal to be accepted. However, significant delay of a reset, preset, or mixed clocking pulse utilizing this method is undesirable.

Figure 15B:
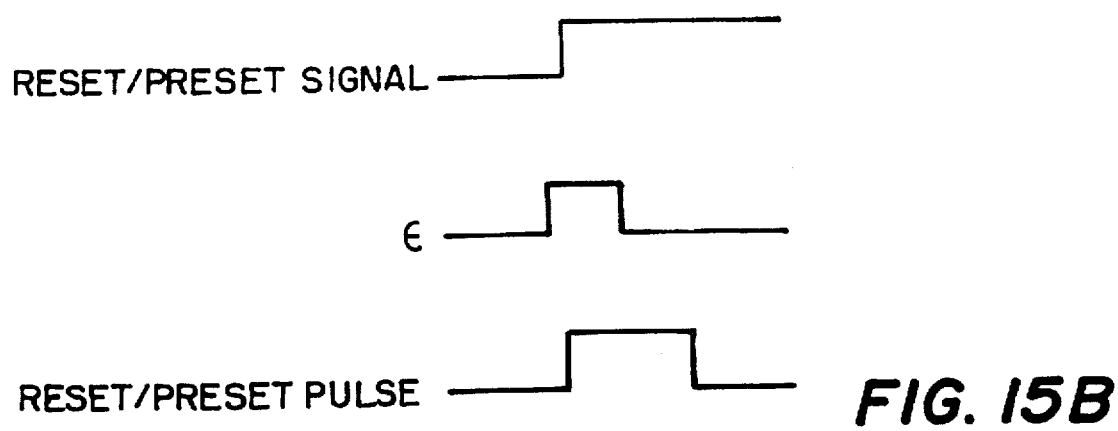
FIG. 15B illustrates a second method to properly enable reset, preset, or a mixed clocking mode signal in a P-type flip-flop.

FIG. 15B illustrates a second method to properly enable reset, preset, or a mixed clocking mode signal in a P-type flip-flop. As shown, the reset, preset or mixed clocking pulse may be lengthened so that from the time of receipt of the leading edge of the reset, preset or mixed clocking signal by the P flip-flop until the time of receipt of the trailing edge of the corresponding reset, preset or mixed clocking pulse by the P flip-flop is longer than the period ϵ as shown in FIG. 15B. Utilizing this method with the reset, preset or mixed clocking pulse extended, the storage element remains transparent for a time period long enough for a reset or preset to occur. Additionally, delay in providing the reset utilizing the method of FIG. 15A is minimized.

Figure 16A:
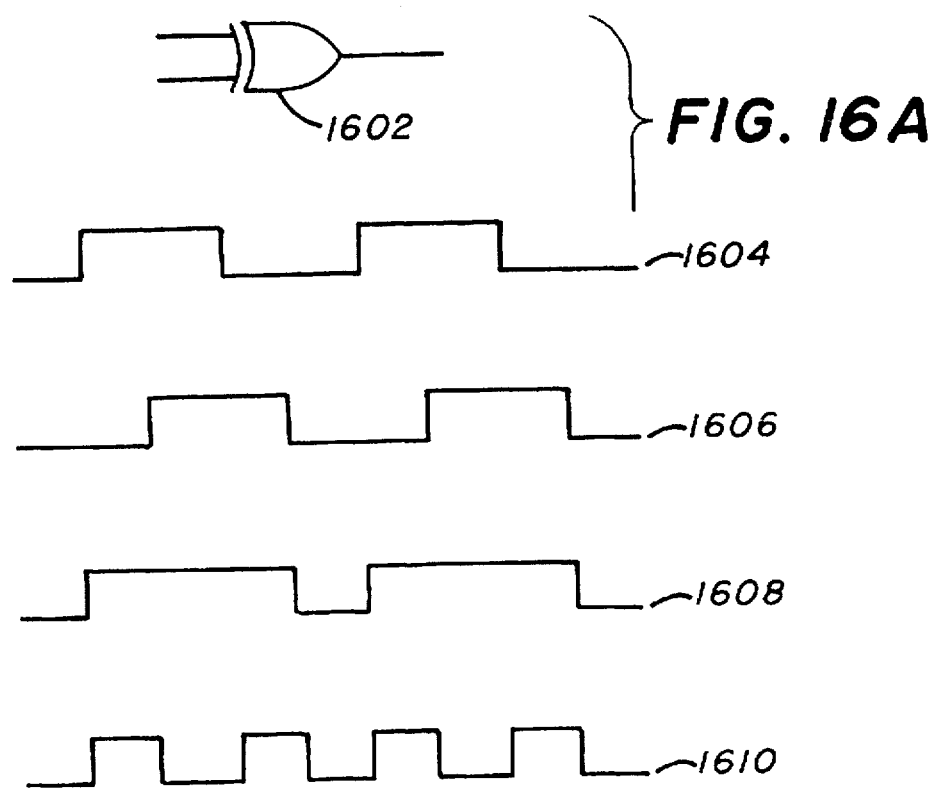
FIG. 16A shows a circuitry which can be provided in the block clock/control circuit of FIG. 5 to provide reset, preset, or mixed clock mode capability without utilizing a pulse generator and signals illustrating operation of the circuit.

FIG. 16A shows circuitry which can be provided in the block clock/control circuit 502 of FIG. 5 to provide reset, preset, or mixed clock mode capability without utilizing a pulse generator and signals illustrating operation of the circuit. As shown, the circuit simply includes an exclusive OR gate 1602. A first clock signal 1604 is provided to a first input of the exclusive OR gate 1602, while the reset, preset or a second clocking signal for mixed clocking 1606 is provided to the second input. The output of exclusive OR gate 1602 then provides a mixed signal 1610 which transitions at transitions of either of its input signals.

For example, if signals 1604 and 1606 are provided as inputs to an OR gate, the mixed signal output of the OR gate would be signal 1608 which transitions at the rising edge of signal 1604, but does not transition at the rising edge of signal 1606. By providing signals 1604 and 1606 as inputs of an exclusive OR gate, signal 1610 transitions at either edge of either signals 1604 or 1606.

Note, however, that signal 1610 does not necessarily provide a rising edge at the rising edge of either of signals 1604 or 1606. Further, the signal 1610 does not provide a D-type flip-flop mode of operation. Therefore, when utilizing the exclusive OR gate 1602 in the block clock/control circuit 502 of FIG. 5, it is desirable that the storage cell 508 be a dual edge triggered D-type flip-flop.

Figure 16B:
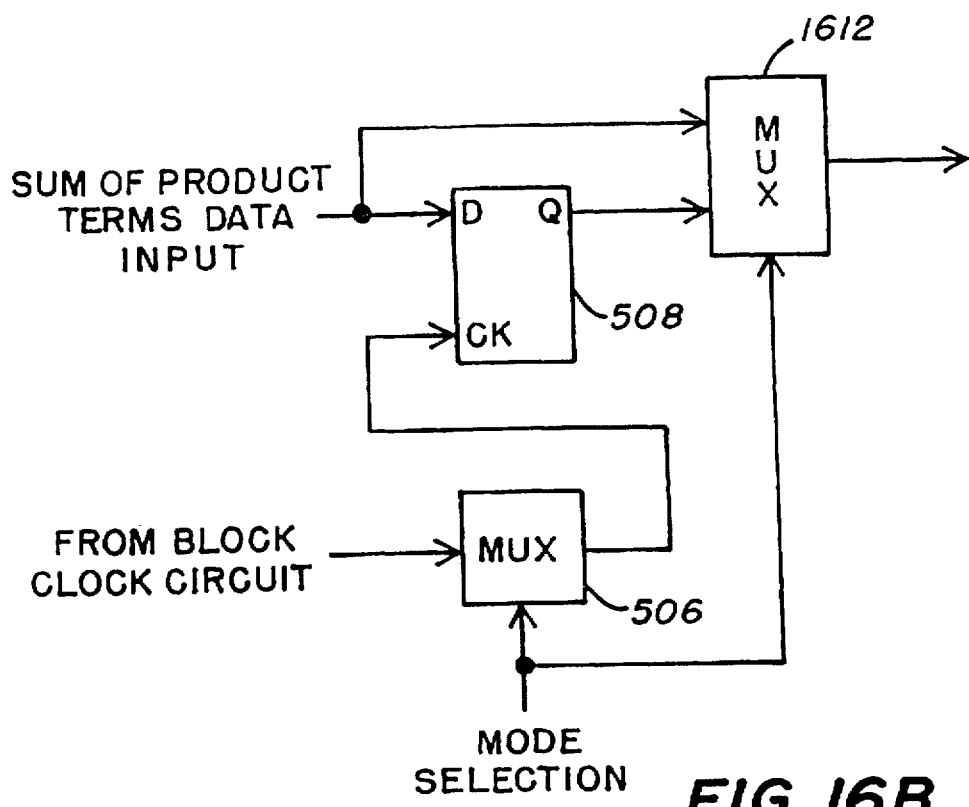
FIG. 16B shows additional circuitry required in the macrocell of a PLD if the exclusive OR gate of FIG. 16A along with a dual edge triggered D-type flip-flop is used to provide reset, preset or mixed clock mode capability.

FIG. 16B shows additional circuitry required in the macrocell of a PLD if the exclusive OR gate of FIG. 16A along with a dual edge triggered D-type flip-flop is used to provide reset, preset or mixed clock mode capability. As shown, the storage element 508 is provided as in FIG. 5, which here functions as the dual edge triggered D-type flip-flop. As in FIG. 5, the storage element 508 has a data input receiving a sum of product terms data input. Further, the multiplexer 506 is provided which receives signals from the block clock/control circuit and a mode selection signal and provides an output to the clock input of storage element 508 as in FIG. 5. Unlike in FIG. 5, because the storage element 508 is a dual edge triggered D-type flip-flop, an additional multiplexer 1612 is provided to enable a combinatorial mode. With a first select signal state, multiplexer 1612 provides the output of storage element 508. However, with a second select signal state, the multiplexer 1612 provides the sum of product terms data signal directly, bypassing storage element 508.

Figure 16C:
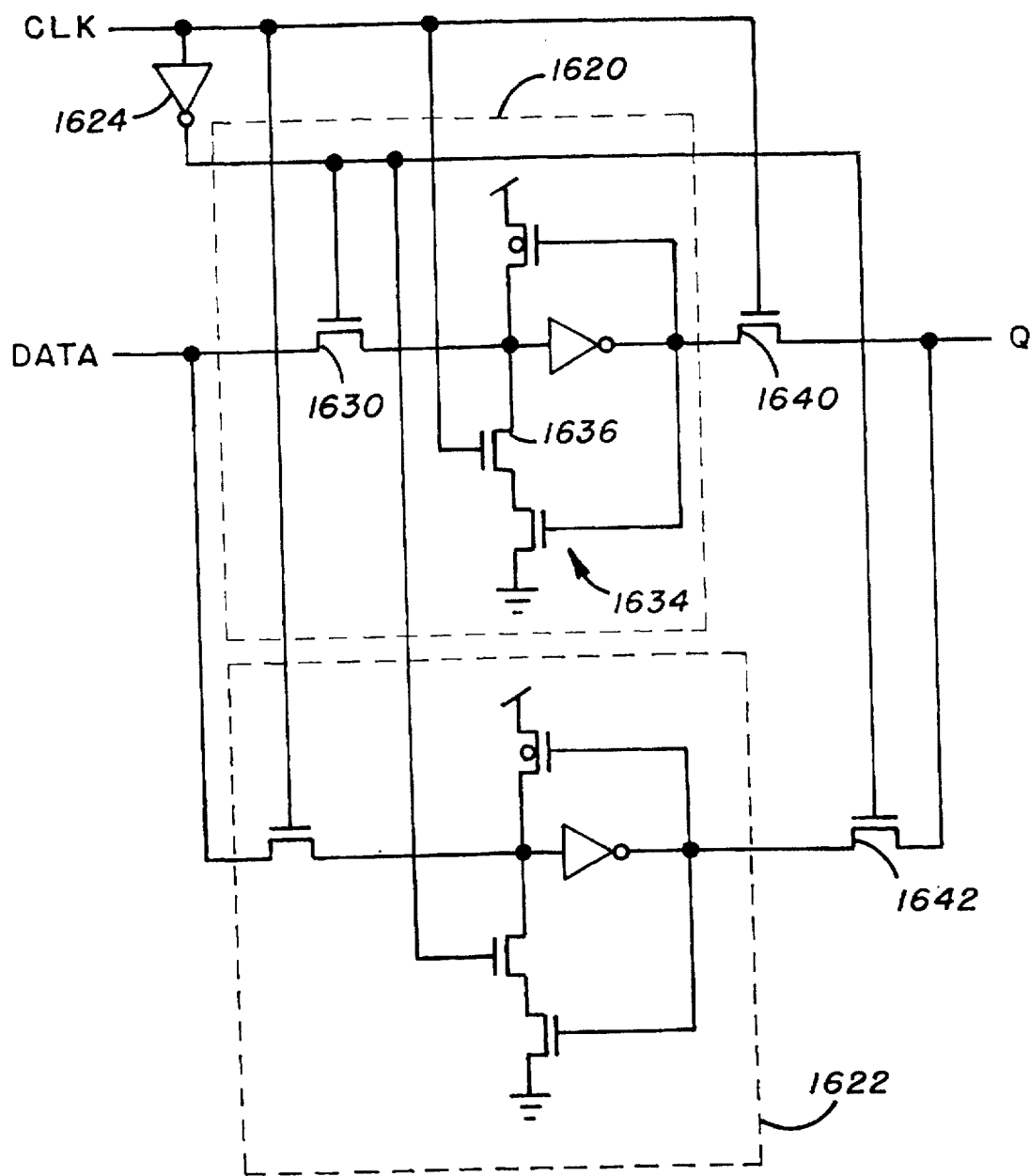
FIG. 16C shows specific circuitry for the dual eged D flip-flop utilized in FIG. 16B.

FIG. 16C shows specific circuitry for the dual eged D flip-flop utilized in FIG. 16B. As shown, the circuit of FIG. 16C includes two configurable latches 1620 and 1622, each being enabled by opposite edges of a clock signal (CLK) of the dual edge D flip-flop provided directly and through inverter 1624. Configurable latches 1620 and 1622 include identical circuit components, so only 1620 will be described. Configurable latch 1620 includes pass gate 1630 with a gate coupled to receive the CLK signal and a source to drain path connecting the data input (DATA) of the dual edge D flip-flop to the input of a latch 1634. One of the inverters of the latch 1634 has a pass gate 1636 connecting its pull down transistor to its pull up transistor, the pull up transistor being very weak. The pass gate 1636 has its gate coupled to receive the CLK signal. The output of latch 1634 is connected through a pass gate 1640 to the Q output of the dual edged D flip-flop, while the output of a similar latch in configurable latch 1622 is connected to the Q output of the dual edged D flip-flop through a pass gate 1642. Pass gates 1640 and 1642 have gates receiving opposite edges of the CLK signal.

Figure 16D:
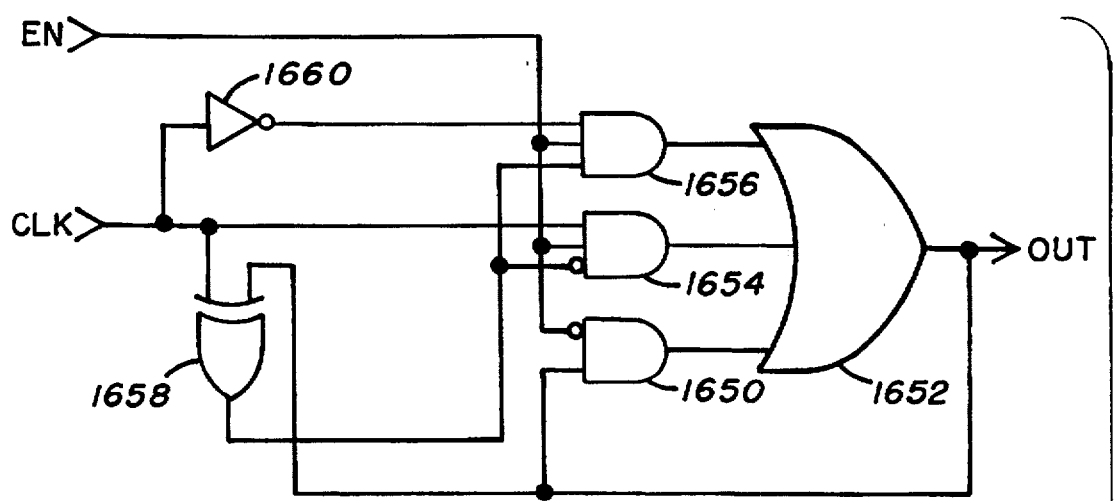
FIG. 16D shows a logic diagram for including at the inputs of the exclusive OR gate of FIG. 16A to provide clock edge selection, along with signals illustrating operation of the circuit.
Figure 16D:
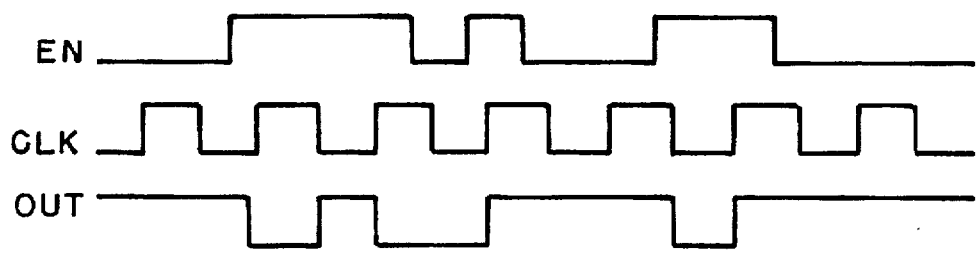

FIG. 16D shows a logic diagram for including at the inputs of the exclusive OR gate of FIG. 16A to provide clock edge selection, along with signals illustrating operation of the circuit. The clock edge selection circuit receives an enable signal (EN) at one input of each of AND gates 1650, 1654 and 1656, the inverse of EN being provided to AND gate 1650. The outputs of AND gates 1650, 1654 and 1656 are provided as inputs of OR gate 1652 to provide the clock edge selection circuit output (OUT). With EN low, therefore, AND gates 1654 and 1656 are disabled and AND gate 1650 is enabled to form a latch with elements 1650 and 1652 to latch the output state.

The output (OUT) is connected to an input of exclusive OR gate 1658. A second input of exclusive OR gate 1658 receives a clock signal (CLK) input to the clock edge selection circuit. The output of exclusive OR gate 1658 is connected to a second input of AND gates 1654 and 1656, the input of 1654 being provided in an inverted form. The CLK signal is further provided directly as an input to AND gate 1654 and through an inverter 1660 to a third input to AND gate 1656. With the CLK and OUT signals so provided, no false edges occur upon enabling or disabling of the EN signal. Timing diagrams for EN, CLK and OUT illustrate the features of the circuit of FIG. 16D.

Figure 16E:
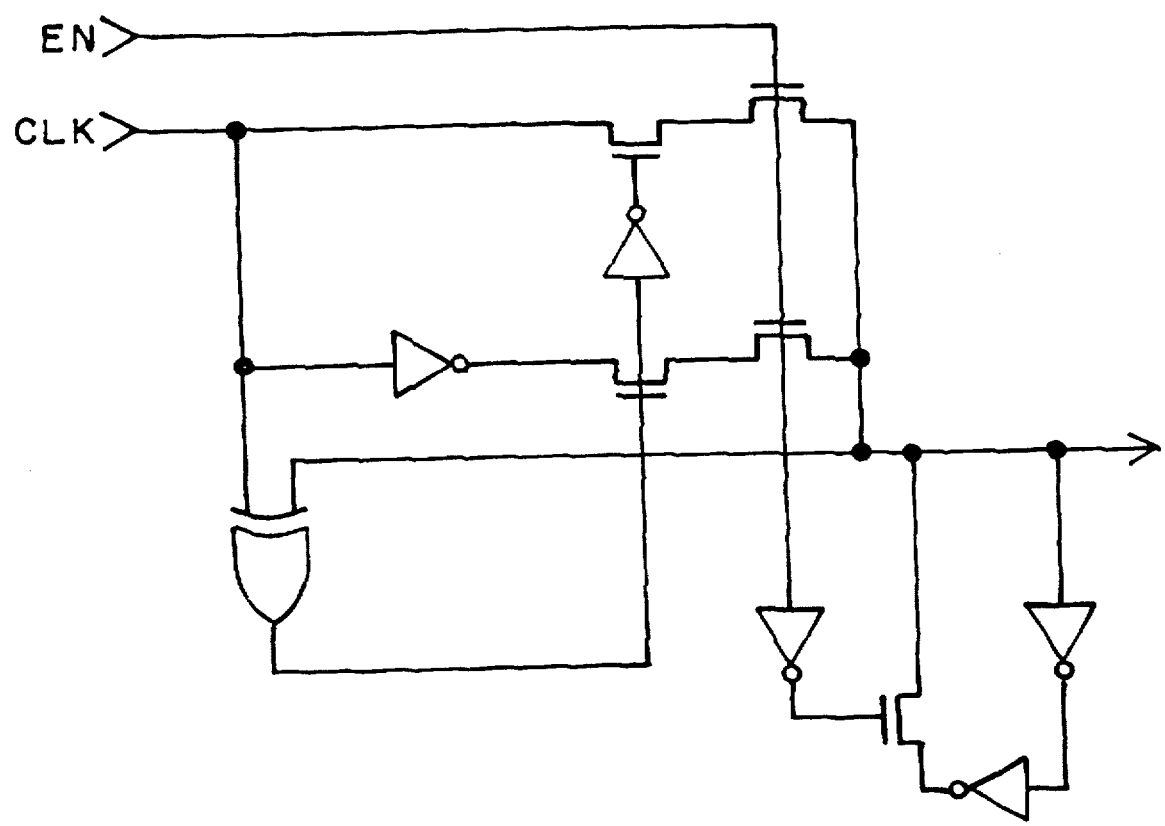
FIG. 16E shows specific circuitry for one embodiment providing the emplementation of the function of the circuit of FIG. 16D.

FIG. 16E shows specific circuitry for one embodiment providing the implementation of the function of the circuit of FIG. 16D.

Figure 17:
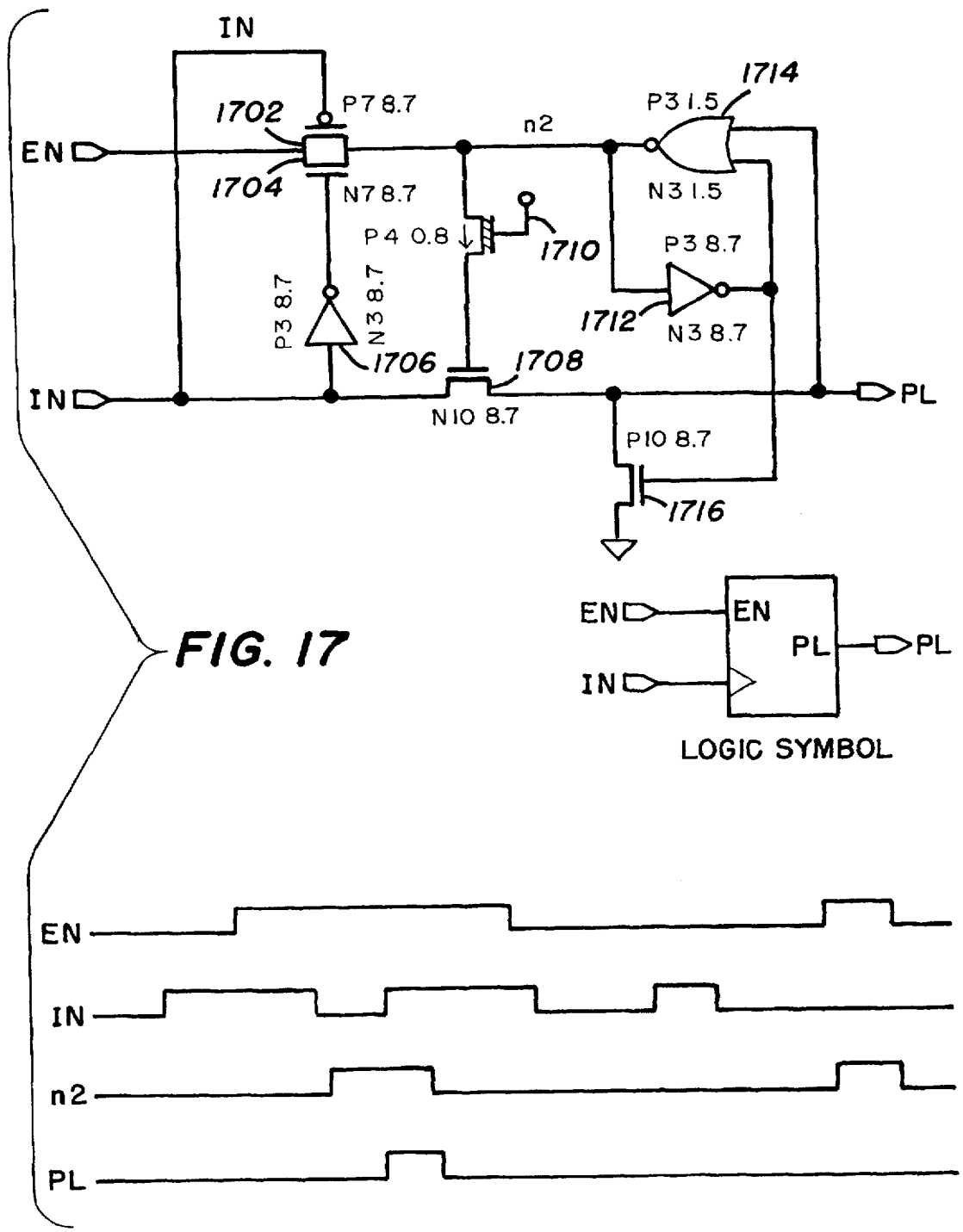
FIG. 17 shows circuitry along with signals from a pulse generator of the present invention utilized for pulse generators which may be included in the block clock/control circuit of FIG. 5.

FIG. 17 shows circuitry along with signals from a pulse generator of the present invention utilized for pulse generators which may be included in the block clock/control circuit 502. The pulse generator of FIG. 17 receives an input signal (IN), such as clock signal 600 of FIG. 6. The pulse generator of FIG. 17 further receives an enable signal (EN) and provides a pulsed output signal (PL). A logic symbol, used subsequently, for such a pulse generator receiving IN and EN signals and providing a PL signal is also shown in FIG. 17.

In the circuitry of FIG. 17, the enable signal EN is received at a first end of the source to drain path of a PMOS pass gate transistor 1702, as well as the first end of the source to drain path of an NMOS pass gate transistor 1704. Second ends of the source to drain paths of transistors 1702 and 1704 are connected together to form a node n2. The gate of transistor 1702 receives the input signal IN at its gate. Additionally, the signal IN is provided through an inverter 1706 to the gate of transistor 1704. Further, the signal IN is provided to a first end of the source to drain path of a pass gate transistor 1708. The second end of the source to drain path of the transistor 1708 provides the pulsed output signal PL.

A source to drain path of a pass gate transistor 1710 connects node n2 to the gate of transistor 1708. The gate of transistor 1710 is connected to Vcc. Hatched lines on transistor 1710 indicate that additional ion implantation, also referred to as creating a depletion mode transistor, is added to the channel between its source and drain to reduce its threshold so that a voltage drop does not occur between node n2 and the gate of transistor 1708 when transistor 1710 is enabled. Transistor 1710 is optionally included as opposed to a direct connection between node n2 and the gate of transistor 1708 to bootstrap the gate of transistor 1708 to improve performance.

An input of an inverter 1712 is additionally connected to node n2, the output of inverter 1712 forming a first input to a NOR gate 1714. A second input of NOR gate 1714 is connected to the second end of transistor 1708 to receive the PL signal. The output of NOR gate 1714 is connected to node n2. The output of inverter 1712 is additionally connected to the gate of a pull down transistor 1716. Transistor 1716 has a source to drain path connecting the second end of the source to drain path of transistor 1708 to Vss.

Transistor sizes and types shown in FIG. 17 are only suggested and may be changed to meet particular design requirements. For instance, transistor sizes in inverter 1712 and NOR gate 1714 are sized to set the pulse length of a pulse provided on the PL signal.

In operation, the circuitry of the pulse generator of FIG. 17 is configured to provide a pulse of the PL signal at a given rising edge of the IN signal if the EN signal remains high from prior to receipt of a rising edge of the IN signal until receipt of the given rising edge of the IN signal. Timing diagrams for the signals IN, EN, PL and an internal node n2 signal are shown to illustrate operation of the circuit of FIG. 17, as described in more detail below.

To describe operation in detail, it is first assumed that the IN signal is high. With IN high, pass gates 1702 and 1704 remain off so that the EN signal does not affect node n2. If n2 was ever high, transistor 1708 turns on so that a high IN signal would be provided as the signal PL so that NOR gate 1714 would pull node n2 low causing transistor 1708 to turn off to further prevent the signal IN from continuing to pass to PL. With n2 low, the output of inverter 1712 will be high turning on transistor 1716 to keep the output PL signal low. With the output of inverter 1712 high, NOR gate 1714 will maintain node n2 low, as long as IN remains high.

Next, it is assumed IN goes from high to low. First, assuming EN is high, with IN going low, transistors 1702 and 1704 will turn on allowing node n2 to charge to a high state. With IN low, although transistor 1708 is enabled, the PL signal will remain low. If EN then returns to low before IN returns to high, n2 will be discharged and PL will not change states when IN goes high at a later time. However, if IN goes back high before EN goes low, transistors 1702 and 1704 will turn off and node n2 will remain high as held by NOR gate 1714 since the output of inverter 1712 and PL remain low. With n2 high, transistor 1708 will be on. If IN then returns to high, PL will go high to cause NOR gate 1714 to pull n2 low to turn off transistor 1708. With n2 now low, the output of inverter 1712 will go high to turn on pull down transistor 1716 and pull down the PL output, thus creating a pulse on the PL signal.

Figure 18:
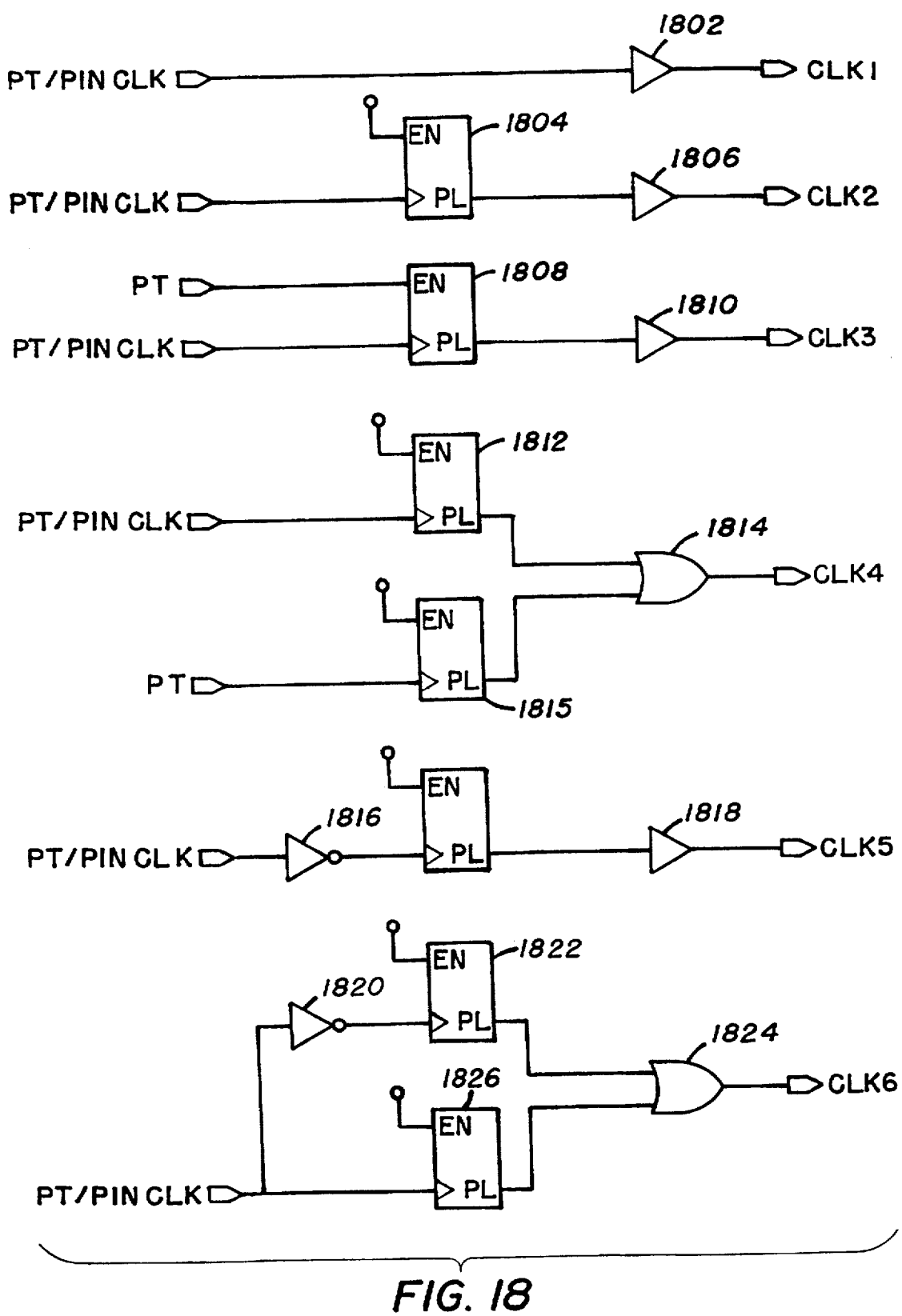
FIG. 18 shows an example of circuitry which may be included in the block clock/control circuit of FIG. 5.

FIG. 18 shows an example of circuitry which may be included in the block clock/control circuit 502, as shown in FIG. 5. As shown, the block clock/control circuit receives inputs from product term (PT) lines, or from pin clock (PIN CLK) inputs. The block clock/control circuit then provides outputs (CLK1–CLK6) to enable clock modes, such as a latch mode, a D-type flip-flop mode, a dual edge clocking mode, and reset/preset modes as described above.

The CLK1 signal provides either a PT or pin clock signal through a buffer 1802 to provide a latch mode signal. Note further, that by having the input be a PT line, as opposed to a pin clock which provides synchronous clocking, asynchronous clocking is selectable.

The CLK2 signal provides either a PT or pin clock signal through a pulse generator 1804, as shown in detail in FIG. 17, with its enable input connected to Vcc, and further through buffer 1806 to provide a D flip-flop mode signal.

The CLK3 signal provides either a PT or pin clock signal through a pulse generator 1808 and buffer 1810. A PT line is connected to the enable input of the pulse generator 1808 to provide a selectable clock enable/disable function.

The CLK4 signal first provides a PT or pin clock signal through a pulse generator 1812 with the enable input of pulse generator 1812 connected to Vcc similar to the CLK2 signal. The output of pulse generator 1812 is provided as the CLK4 signal through an OR gate 1814. Further, the CLK4 signal provides a PT signal through a pulse generator 1815 to another input of the OR gate 1714, which may for instance carry a reset or preset signal. Note that with reset or preset proided by pulse generator 1815, the pulse width of pulse generator 1815 will be made slightly larger than with pulse generator 1812 for reasons discussed previously. The CLK4 signal can thus provide a combination clock pulse and reset pulse signal, such as 1405 of FIG. 14.

The CLK5 signal provides a PT or pin clock signal through an inverter 1816, pulse generator 1817 and buffer 1818. By having a choice of providing a clock or PT signal directly, as with CLK2, or through an inverter, as with CLK5, more Boolean operations are enabled. For instance, with a product term of three elements A, B and $\overline{C}$ provided on a single PT line, the PT line can provide the Boolean product expression $(A*B*\overline{C})$. However, by providing the same PT line through an inverter, a Boolean sum expression is obtained $(\overline{A}+\overline{B}+)$. Utilizing the sum expression, a mixture of clock signals can be provided as the clock output of CLK5. Additionally, by choosing between the CLK2 and CLK5, clock edge selection is provided.

Finally the CLK6 signal provides a dual edge clocking signal from a PT or pin clock input. As shown, to provide the dual edge clocking, the PT or pin clock signal is provided through an inverter 1820 through a pulse generator 1822 with its enable input connected to Vcc to a first input of an OR gate 1824. The PT or pin clock input is further provided directly through a pulse generator 1826 to an additional input of OR gate 1824. The output of OR gate 1824 then provides the CLK6 signal which provides pulses at both the rising and falling edges of an input PT or pin clock signal.

Note that although configurations for clock signal circuitry is provided for six outputs CLK1–CLK6, combinations of the circuitry providing any of signal outputs CLK1–CLK6 can be combined to provide additional signals.

Figure 19:
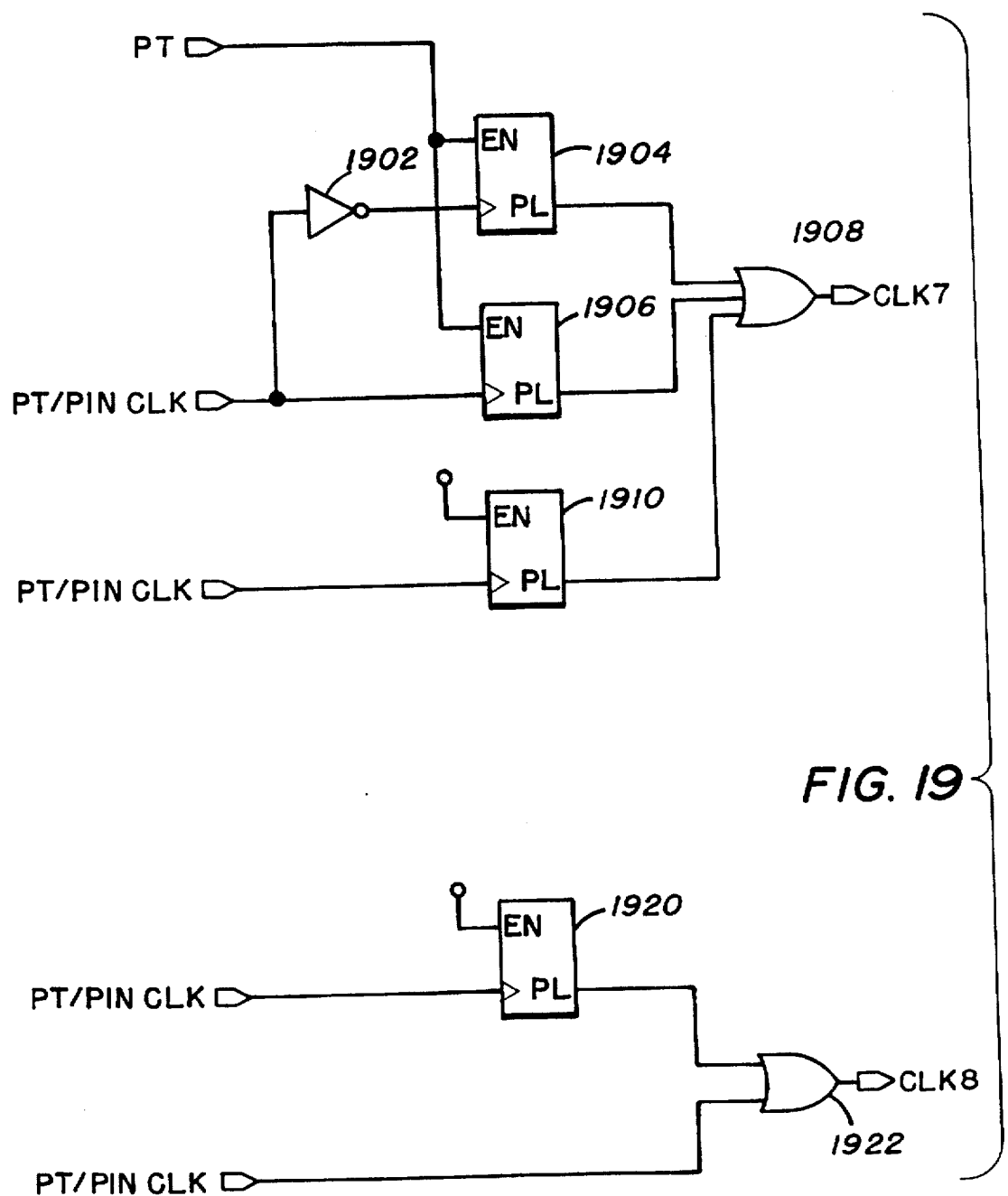
FIG. 19 illustrates how circuit configurations providing particular clock signal outputs in FIG. 18 may be combined to create additional clock signal outputs.

For example, FIG. 19 illustrates how circuit configurations providing particular clock signal outputs in FIG. 18 may be combined to create additional clock signals. The CLK7 signal combines the features of dual edged clocking of CLK6, clock enable of CLK3 and reset or preset as in CLK4 of FIG. 18. Dual edged clocking is provided using inverter 1902 and pulse generators 1904 and 1906 connected to OR gate 1908. Clock enable is provided with a PT line connected to the enable inputs of pulse generators 1904 and 1906. A reset or preset is then provided through pulse generator 1910 to another input of OR gate 1908.

The CLK8 signal selectably combines a signal from a pulse generator, as with CLK2, with a separate signal which is not pulsed to create a mixed clocking signal, including a latch mode and a D-type flip-flop mode signal. A first PT or pin clock input is provided through a pulse generator 1920 to the first input of OR gate 1922 to form a first pulsed signal, while a second PT or pin clock input is provided to a second input of OR gate 1922. The output of the OR gate 1922 then provides the CLK8 signal which is a mixed latch mode and D-type flip-flop mode signal.

Although block clock/control circuit 502 requires additional hardware to be added to the PLD chip, the hardware is a shared resource of all macrocells on the PLD. The block circuit will, therefore, not require significant chip space in comparison to conventional circuits which utilize redundant circuitry in each separate macrocell.

Although the invention has been described above with particularity, this was merely to teach one of ordinary skill in the art how to make and use the invention. Many modifications will fall within the scope of the invention, as that scope is defined by the claims which follow.

What is claimed is:

1. A clock signal providing circuit receiving an enable signal and a clock signal and having an output, the clock signal providing circuit comprising:

an OR gate having an output providing the output of the clock signal providing circuit, and having inputs;

an exclusive OR gate having a first input receiving the clock signal, a second input connected to the OR gate output, and having an output;

a first AND gate having a first input receiving an inverse of the exclusive OR gate output, a second input receiving the clock signal, a third input receiving the enable signal and an output connected to an input of the OR gate; and a second AND gate having a first input receiving the exclusive OR gate output, a second input receiving the inverse of the clock signal, a third input receiving the enable signal and an output connected to an input of the OR gate; and a third AND gate having a first input receiving an inverse of the enable signal and a second input connected to the OR gate output and an output provided to an input of the OR gate.

2. A clock signal providing circuit receiving an enable signal and a clock signal and having an output, the clock signal providing circuit comprising:

an exclusive OR gate having a first input receiving the clock signal, and a second input connected to the clock signal providing circuit output;

a first pass gate having a source to drain path with a first end receiving the clock signal and a second end having a gate receiving an inverse of the output of the exclusive OR gate;

a second pass gate having a source to drain path connecting the second end of the first pass gate to the output of the clock signal providing circuit, and having a gate receiving the enable signal;

a third pass gate having a source to drain path with a first end receiving an inverse of the clock signal and a second end, and having a gate receiving the output of the exclusive OR gate;

a fourth pass gate having a source to drain path connecting the second end of the third pass gate to the output of the clock signal providing circuit, and having a gate receiving the enable signal; and a fifth pass gate having a gate receiving an inverse of the enable signal and a source to drain path having a first end connected to the output of the clock signal providing circuit and a second end; and two series connected inverters for connecting the output of the clock signal providing circuit to the second end of the source to drain path of the fifth pass gate.

3. A pulse generator having a first input for receiving the clock signal, a second input for receiving an enable signal, and an output, the pulse generator comprising:

a PMOS pass gate having a gate forming the first input of the pulse generator and a source to drain path connected with a first end forming the second input of the pulse generator and a second end connected to a first node;

an NMOS pass gate having a gate, and a source to drain path connected on a first end to the second input of the pulse generator and on a second end to the first node;

a first inverter with an input connected to the first input of the pulse generator and a second end connected to the gate of the NMOS pass gate;

a third pass gate having a gate coupled to the first node, and a source to drain path connected from the first input to the output of the pulse generator;

a NOR gate having a first input connected to the output of the pulse generator, a second input, and an output connected to the first node;

a second inverter connected from the first node to the second input of the NOR gate; and a pull down transistor having a source to drain path connecting the output of the pulse generator to a voltage connection Vss and a gate connected to the second input of the NOR gate.

* * * * *